(12) United States Patent  
Kurokawa

(10) Patent No.: US 7,164,141 B2
(45) Date of Patent: Jan. 16, 2007

(54) CHARGED PARTICLE BEAM PHOTOLITHOGRAPHY MACHINE, STANDARD SUBSTRATE FOR CORRECTING MISALIGNMENT FACTOR OF CHARGED PARTICLE BEAM PHOTOLITHOGRAPHY MACHINE, CORRECTING METHOD FOR CHARGED PARTICLE BEAM PHOTOLITHOGRAPHY MACHINE, AND METHOD OF MANUFACTURING ELECTRONIC DEVICE

(75) Inventor: Masaki Kurokawa, Tokyo (JP)

(73) Assignee: Advantest Corp., Tokyo (JP)

( * ) Notice: Subject to any disclaimer, the term of this patent is extended or adjusted under 35 U.S.C. 154(b) by 113 days.

(21) Appl. No.: 11/090,244

(22) Filed: Mar. 25, 2005

(65) Prior Publication Data

US 2005/0211929 A1  Sep. 29, 2005

(30) Foreign Application Priority Data

Mar. 29, 2004  (JP)  ............................. 2004-097003

(51) Int. Cl.
*H01L 21/027* (2006.01)
*G03F 7/20* (2006.01)

(52) U.S. Cl. ............................. 250/491.1; 250/252.1; 250/492.22

(58) Field of Classification Search .................... None
See application file for complete search history.

(56) References Cited

U.S. PATENT DOCUMENTS 4,442,361 A *  4/1984  Zasio et al. ............... 250/491.1
5,280,437 A *  1/1994  Corliss ......................... 702/94
6,762,421 B1*  7/2004  Nakasugi .................. 250/491.1

FOREIGN PATENT DOCUMENTS

JP  2002-110516  4/2002

* cited by examiner

*Primary Examiner*—Jack I. Berman
(74) *Attorney, Agent, or Firm*—Muramatsu & Associates

(57) ABSTRACT

A charged particle beam photolithography machine includes an electron gun, a deflector, a wafer stage, a standard substrate formed with a chip-shaped first mark group having a plurality of first marks and a chip-shaped second mark group having a plurality of second marks, a correction map having misalignment factors of the first marks based on positions of the second marks, and a deflection control unit for controlling an amount of deflection in the deflector. The charged particle is irradiated on a wafer while the deflection control unit makes reference to the correction map and corrects the amount of deflection as equivalent to the misalignment factors.

14 Claims, 22 Drawing Sheets

FIG. 11

| POSITION | ERROR VECTOR |
|---|---|
| ⋮ | ⋮ |
| i, j; p, q | $\Delta \vec{R}^{(i,j)}{}_{p,q}$ |
| i, j; p+1, q | $\Delta \vec{R}^{(i,j)}{}_{p+1,q}$ |
| i, j; p+1, q+1 | $\Delta \vec{R}^{(i,j)}{}_{p+1,q+1}$ |
| ⋮ | ⋮ |
| i+1; j, p, q | $\Delta \vec{R}^{(i+1,j)}{}_{p,q}$ |
| ⋮ | ⋮ |
| i+1; j+1, p, q | $\Delta \vec{R}^{(i+1,j+1)}{}_{p,q}$ |
| ⋮ | ⋮ |

| POSITION n=(i, j, p, q) | ERROR VECTOR |
|---|---|
| ⋮ | ⋮ |
| n=(i, j, p, q) | $(f_x(x_n, y_n)+g_x(X_n, Y_n), f_y(x_n, y_n)+g_y(X_n, Y_n))$ |
| n=(i, j, p+1, q) | $(f_x(x_n, y_n)+g_x(X_n, Y_n), f_y(x_n, y_n)+g_y(X_n, Y_n))$ |
| n=(i, j, p+1, q+1) | $(f_x(x_n, y_n)+g_x(X_n, Y_n), f_y(x_n, y_n)+g_y(X_n, Y_n))$ |
| ⋮ | ⋮ |
| n=(i+1, j, p, q) | $(f_x(x_n, y_n)+g_x(X_n, Y_n), f_y(x_n, y_n)+g_y(X_n, Y_n))$ |
| ⋮ | ⋮ |
| n=(i+1, j+1, p, q) | $(f_x(x_n, y_n)+g_x(X_n, Y_n), f_y(x_n, y_n)+g_y(X_n, Y_n))$ |
| ⋮ | ⋮ |

M

CHARGED PARTICLE BEAM PHOTOLITHOGRAPHY MACHINE, STANDARD SUBSTRATE FOR CORRECTING MISALIGNMENT FACTOR OF CHARGED PARTICLE BEAM PHOTOLITHOGRAPHY MACHINE, CORRECTING METHOD FOR CHARGED PARTICLE BEAM PHOTOLITHOGRAPHY MACHINE, AND METHOD OF MANUFACTURING ELECTRONIC DEVICE

CROSS-REFERENCE TO RELATED APPLICATIONS

This application is based on and claims priority of Japanese Patent Application No. 2004-97003, filed on Mar. 29, 2004, the entire contents of which are being incorporated herein by reference.

BACKGROUND OF THE INVENTION

1. Field of the Invention

The present invention relates to a charged particle beam photolithography machine, a standard substrate for correcting a misalignment factor of the charged particle beam photolithography machine, a correcting method for the charged particle beam photolithography machine, and a method of manufacturing an electronic device.

2. Description of the Prior Art

Along with miniaturization of semiconductor devices such as LSIs in recent years, an electron beam (EB) photolithography machine is drawing attention as a leading photolithography machine that can correspond to a next-generation fine design rule. The electron beam photolithography machine is configured to deflect an electron beam by use of an electric field or a magnetic field and thereby to draw patterns on a photoresist on a wafer. It is now under consideration to introduce the electron beam photolithography machine not only to a design tool for research and development purposes but also to a "system on chip" (SoC) production line which needs to deal with limited production of diversified products.

To irradiate an electron beam onto a predetermined position with the electron beam photolithography machine, a stage for placing a wafer is moved or an amount of deflection of the electron beam is adjusted. However, in reality, it is not possible to irradiate the electron beam accurately onto a targeted position on the wafer due to distortion of the stage and the like. Accordingly, the electron beam photolithography machine is configured to irradiate the electron beam onto the targeted position while adding an amount of correction considering the distortion of the stage and the like to the amount of deflection.

There are several methods of obtaining such an amount of correction (correcting methods). One example of the methods will be described below.

FIG. 1 is a cross-sectional view showing part of an EB photolithography machine around a wafer stage according to a conventional example.

A wafer stage 1 is moved in a lateral direction of the illustration sheet by a motor 2. Then, a position of the wafer stage 1 is measured by irradiating a laser from an optical interferometer 3 onto a mirror 5 and measuring reflected light with the optical interferometer 3. Actually, there is also another motor for moving the wafer stage perpendicularly to the illustration sheet; however, the description of the other motor will be omitted herein.

Meanwhile, a reflected electron detector 4 is placed above the wafer stage 1. Reflected electrons generated when irradiating the electron beam onto a standard wafer Ws to be described later are detected on the reflected electron detector 4 configured to specify a location on the wafer Ws where the reflected electrons are generated.

To correct the electron beam photolithography machine, the standard wafer Ws for correction is firstly placed on this wafer stage 1.

FIG. 2 is a plan view of the standard wafer Ws according to the conventional example. As shown in the drawing, the standard wafer Ws includes a plurality of mark groups $C_{i,j}$ in chip shapes which are arranged vertically and horizontally. Moreover, each of the mark groups $C_{i,j}$ includes a plurality of marks $M_{p,q}$, which are holes formed on the standard wafer Ws and are arranged in a matrix. In this notation, $(i,j)$ indicates the mark group on an i-th row and on a j-th column in terms of the plane of the wafer, and $(p,q)$ indicates a mark on a p-th row and on a q-th column in each mark group.

Next, the way of correction using the standard wafer Ws will be described with reference to FIG. 3.

FIG. 3 is an enlarged plan view of the standard wafer Ws placed on the wafer stage 1.

As shown in the drawing, if there is no distortion on the wafer stage 1 and the mark $M_{p,q}$ is accurately patterned on the wafer Ws, then the mark $M_{p,q}$ is located in an ideal position A. However, in reality, due to an error caused upon formation of the mark $M_{p,q}$ on the wafer Ws such as an error attributable to a stepper, the mark $M_{p,q}$ is formed in a position B which is distant from the position A by a vector $\Delta P$.

Moreover, the wafer Ws may be expanded or contracted if the wafer stage 1 is distorted or if the wafer stage 1 carries dust thereon. Accordingly, the mark $M_{p,q}$ is further moved to a position which is distant from the position B by a vector $\Delta Q$.

As a result, the mark $M_{p,q}$ may be moved to a position C which is distant from the ideal position A by a vector $\Delta R$ ($=\Delta P+\Delta Q$).

Among these vectors, the error vector $\Delta P$ is the error caused by the stepper used for fabricating the standard wafer Ws, which is generated by distortion of reticle, for example. Accordingly, if the same stepper is used for forming a device pattern on a product wafer, this device pattern will also carry the same error $\Delta P$. Therefore, when a resist pattern is formed by irradiating the electron beam onto the product wafer without correcting the amount of deflection, the resist pattern and the device pattern cause the same misalignment factor attributable to the wafer stage 1 in the amount equal to $\Delta Q$, and the misalignment factor does not include $\Delta P$.

Therefore, as shown in FIG. 4, before and after placing a subsequent product wafer W on the wafer stage 1, a point D1 corresponding to the mark $M_{p,q}$ on the product wafer W is moved by $\Delta Q$ irrespective of $\Delta P$.

Accordingly, even if the electron beam is irradiated onto a point D2 without considering the error vector $\Delta Q$, the electron beam will not be irradiated onto a point D2 on the product wafer W on the wafer stage 1, but will be irradiated onto a point distant from the point D2 by $-\Delta Q$, i.e., onto the point D1 on the product wafer W before being placed on the wafer stage 1.

To avoid this, conventionally, the above-described error vector $\Delta Q$ is obtained in advance, and the electron beam is further deflected by this $\Delta Q$ when irradiating the electron beam onto the product wafer W so as to irradiate the desirable electron beam onto the point D2 on the wafer stage 1.

As shown in FIG. 3, $\Delta Q$ is equal to $\Delta R-\Delta P$. Accordingly, $\Delta Q$ is obtained by measuring the $\Delta R$ and $\Delta P$.

Among these vectors, $\Delta R$ is obtained as follows. Firstly, as shown in FIG. 1, the standard wafer Ws is actually placed on the wafer stage 1. Then, the wafer stage 1 is moved by the motor 2 while confirming the position of the wafer stage 1 with the optical interferometer 3, and the wafer stage 1 is stopped at a point where the optical interferometer 3 assumes that an optical axis is aligned with the mark Mp,q. However, due to the above-described reason, the optical axis does not always coincide with the mark Mp,q at this point because of distortion of the wafer stage 1 or dust. The stage position at this point will be indicated as R1.

Subsequently, the electron beam is irradiated onto the standard wafer Ws along the optical axis without deflection. At this time, the reflected electrons from the mark Mp,q will be captured by the reflected electron detector 4 if the optical axis actually coincides with the mark Mp,q. However, this does not occur due to the above-described reason. Accordingly, the wafer stage 1 is moved by the motor 2 to find a stage position where the reflected electron detector 4 responds. The stage position at this point will be indicated as R2. The position R2 is the position of the wafer stage 1 when the mark Mp,q actually coincides with the optical axis.

Thereafter, R1-R2 is calculated by use of the values obtained as described above, and the calculated value is equal to $\Delta R$.

On the other hand, the standard wafer Ws is put into an optical coordinate measuring instrument, and the error $\Delta P$ (see FIG. 3) not attributable to the wafer stage 1 such as the error of the stepper is measured by this optical coordinate measuring instrument.

Then, the value of $\Delta Q$ will be obtained by calculating $\Delta R-\Delta P$ with the values measured as described above.

However, the optical coordinate measuring instrument used for measuring the error $\Delta P$ not attributable to the wafer stage 1 is extremely expensive. Accordingly, a unit price for measuring one mark Mp,q is costly. As a result, expenses used for measuring all the marks on the standard wafer Ws will be enormous.

SUMMARY OF THE INVENTION

An object of the present invention is to provide a charged particle beam photolithography machine, a standard substrate for correcting a misalignment factor of the charged particle beam photolithography machine, a correcting method for the charged particle beam photolithography machine, and a method of manufacturing an electronic device, which are capable of performing correction at low costs.

In a first aspect of the present invention, there is provided a charged particle beam photolithography machine, which includes a source of a charged particle, a deflector for deflecting the charged particle, a substrate table for placing a substrate, a standard substrate formed with a chip-shaped first mark group having a plurality of first marks and a chip-shaped second mark group having a plurality of second marks, a correction map having misalignment factors of the first marks obtained by measurement based on positions of the second marks in a state placed on the substrate table, and a deflection control unit for controlling an amount of deflection in the deflector. Here, the charged particle is irradiated on a product substrate while the deflection control unit makes reference to the correction map and corrects the amount of deflection as equivalent to the misalignment factors.

According to the present invention, the amount of deflection is corrected as equivalent to the displacement of the first marks based on the positions of the second marks. The displacement can be measured easily and accurately by use of a coordinate measuring instrument included in the charged particle beam photolithography machine such as a reflected electron detector. Since it is not necessary to use an expensive machine such as an optical coordinate measuring instrument, it is possible to reduce costs required for correction.

In a second aspect of the present invention, there is provided a standard substrate for a charged particle beam photolithography machine, which includes a chip-shaped first mark group having a plurality of first marks, and a chip-shaped second mark group having a plurality of second marks formed so as to be overlaid on part of the first mark group.

In a third aspect of the present invention, there is provided a method of correcting a charged particle beam photolithography machine, which includes the steps of forming a chip-shaped first mark group having a plurality of first marks on a substrate, forming a chip-shaped second mark group having a plurality of second marks so as to be overlaid on part of the first mark group and thereby forming the substrate into a standard substrate, placing the standard substrate on a substrate table of a charged particle beam photolithography machine and measuring misalignment factors of the first marks based on positions of the second marks, and adopting the misalignment factors as correction values for an amount of deflection of a charged particle beam.

According to the present invention, the step of measuring the misalignment factors of the first marks based on the positions of the second marks can be achieved easily and accurately by use of a coordinate measuring instrument included in the charged particle beam photolithography machine such as a reflected electron detector without using an expensive machine such as an optical coordinate measuring instrument. Therefore, it is possible to reduce costs required for correction.

Alternatively, it is also possible to adopt in-plane distribution of the misalignment factors of the first marks within the standard substrate as observed values and to obtain a first unknown function continuously varying within the standard substrate and a second unknown function repeated for each first mark group by use of a least square method.

In this way, the misalignment factors of the first marks are approximated by a sum of the obtained first unknown function and the obtained second unknown function. Moreover, a cause of occurrence of the misalignment factors can be understood by observing behaviors of the first and second unknown functions.

In a fourth aspect of the present invention, there is provided a method of manufacturing an electronic device, which includes the steps of forming a chip-shaped first mark group having a plurality of first marks and a chip-shaped second mark group having a plurality of second marks so as to be partially overlaid on the first mark group on a substrate in accordance with photolithography using a photolithography machine and thereby forming the substrate into a standard substrate, placing the standard substrate on a substrate table of a charged particle beam photolithography machine, measuring misalignment factors of the first marks based on positions of the second marks after placing the standard substrate on the substrate table, removing the standard substrate from the substrate table, coating a resist on a product substrate, placing the product substrate on the substrate table after coating the resist, adopting the misalignment factors as correction values for an amount of deflection of a charged particle beam and irradiating a charged particle onto the resist while correcting the amount of deflection as equivalent to the correction value, and developing the resist to form a resist pattern.

According to the present invention, the standard substrate is fabricated in accordance of the photolithography using the photolithography machine, then the misalignment factors of the first marks based on the positions of the second marks are measured by use of the standard substrate, and the amount of deflection is corrected as equivalent to the misalignment factors in terms of the product substrate. The misalignment factors include errors attributable to the photolithography machine and to the substrate table. Therefore, by performing this correction, a pattern formed in advance on the product substrate by use of the same photolithography machine and the resist pattern formed in accordance with this method are desirably overlaid in each chip. Similarly, a pattern to be formed by use of the same photolithography machine after carrying out this method and the above-described resist pattern are desirably overlaid as well.

As described above, according to the present invention, the misalignment factors of the first marks are measured based on the positions of the second marks of the standard substrate, and the charged particle is irradiated on the substrate while correcting the amount of deflection as equivalent to the misalignment factors. The misalignment factors can be easily and accurately measured by the reflected electron detector included in the charged particle beam photolithography machine. Since it is not necessary to use an expensive machine such as an optical coordinate measuring instrument, it is possible to reduce costs required for correction.

Moreover, by obtaining the first unknown function continuously varying within the standard substrate and the second unknown function repeated for each first mark group by use of the least square method based on the in-plane distribution of the misalignment factors and by observing the behaviors of these functions, the cause of occurrence of the misalignment factors is understood.

Furthermore, the pattern is fabricated on the product pattern in accordance with the photolithography using the same photolithography machine applied to form the above-described standard substrate. Accordingly, it is possible to overlay this pattern on the resist pattern fabricated by use of the charged particle beam photolithography machine desirably for each chip.

BRIEF DESCRIPTION OF THE DRAWINGS

FIG. 11 is a table showing an example of a correction map to be made in the embodiment of the present invention.

FIG. 16 is a table showing another example of the correction map to be made in the embodiment of the present invention.

DESCRIPTION OF THE PREFERRED EMBODIMENT

Next, an electron beam photolithography machine according to an embodiment of the present invention will be described.

(1) Configuration of Electron Beam Photolithography Machine

Figure 1:
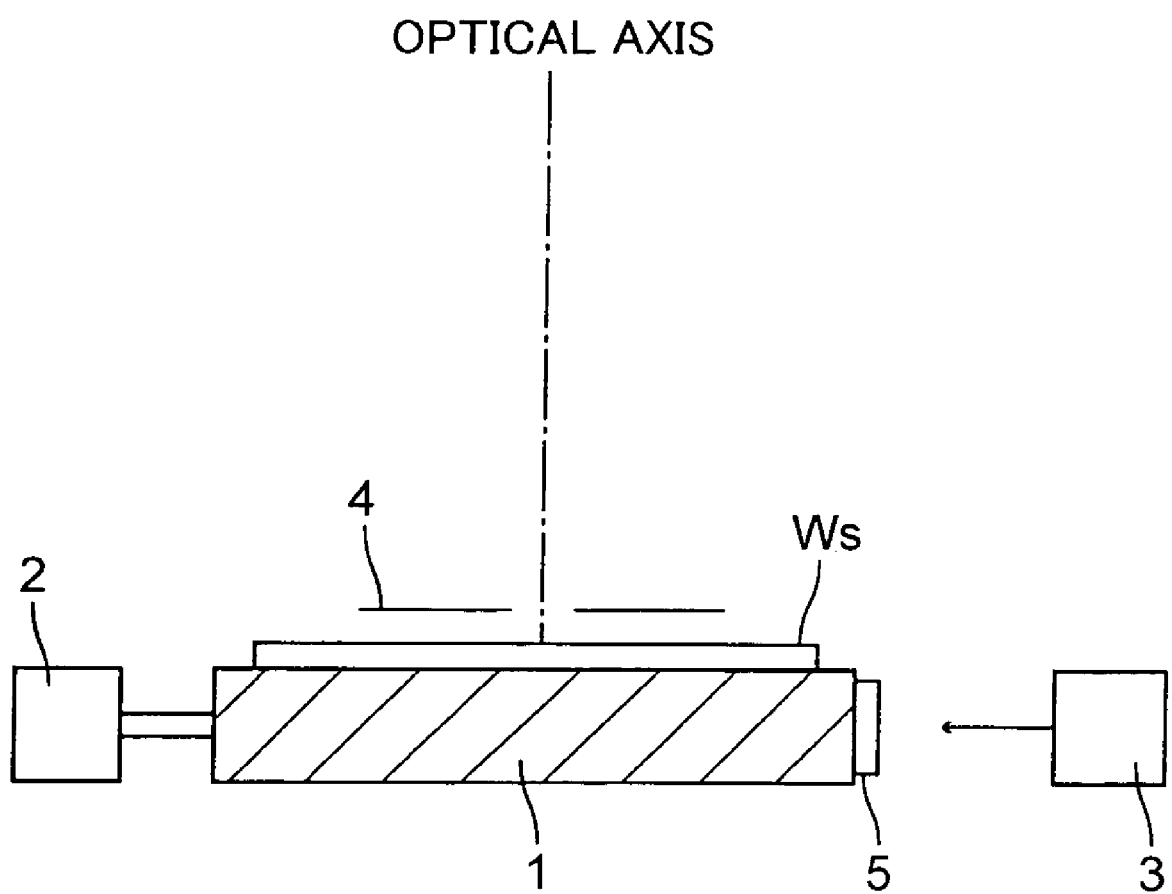
FIG. 1 is a cross-sectional view showing part of an electron beam photolithography machine around a wafer stage according to a conventional example.
Figure 2:
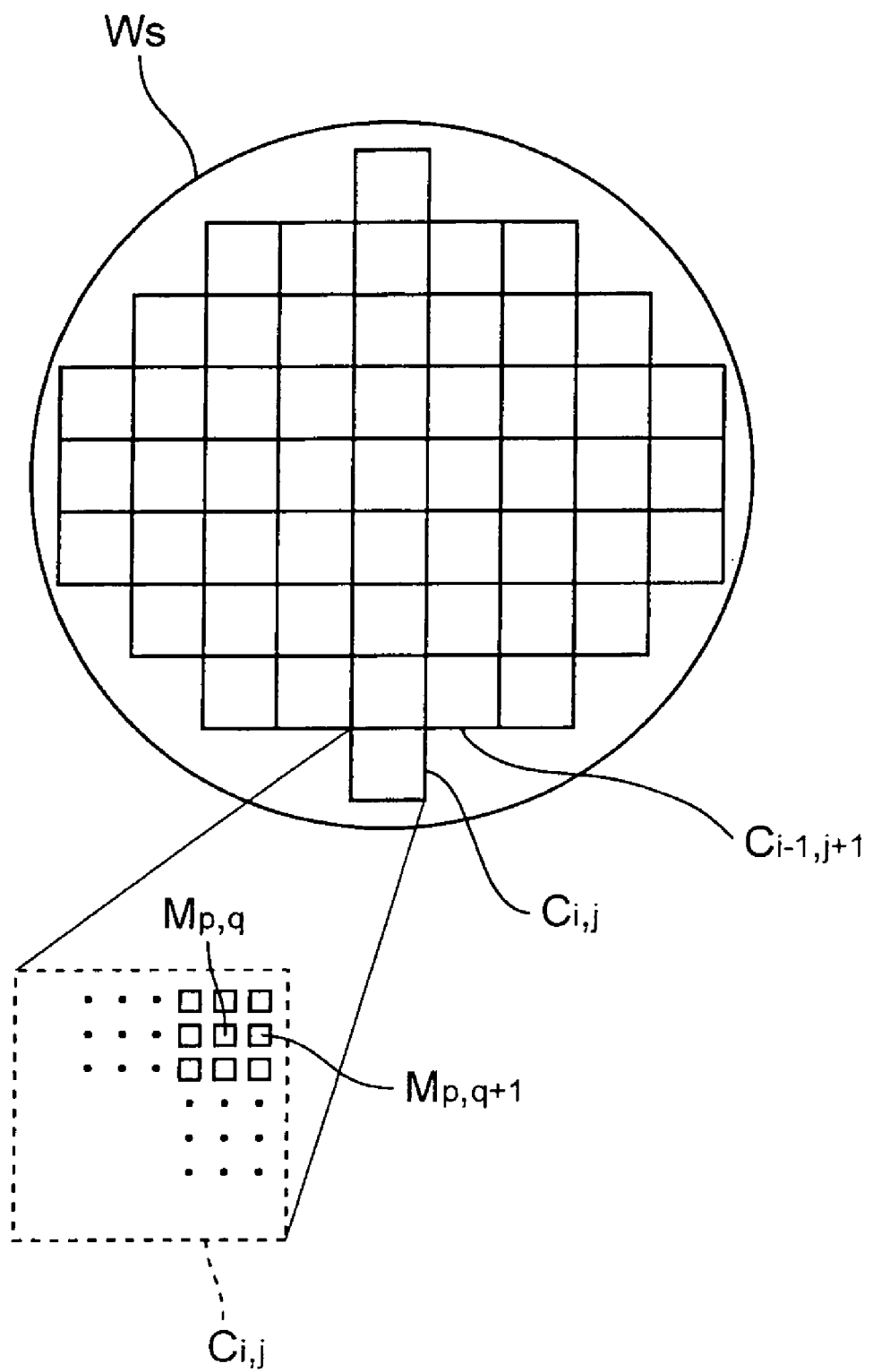
FIG. 2 is a plan view of a standard wafer according to the conventional example.
Figure 3:
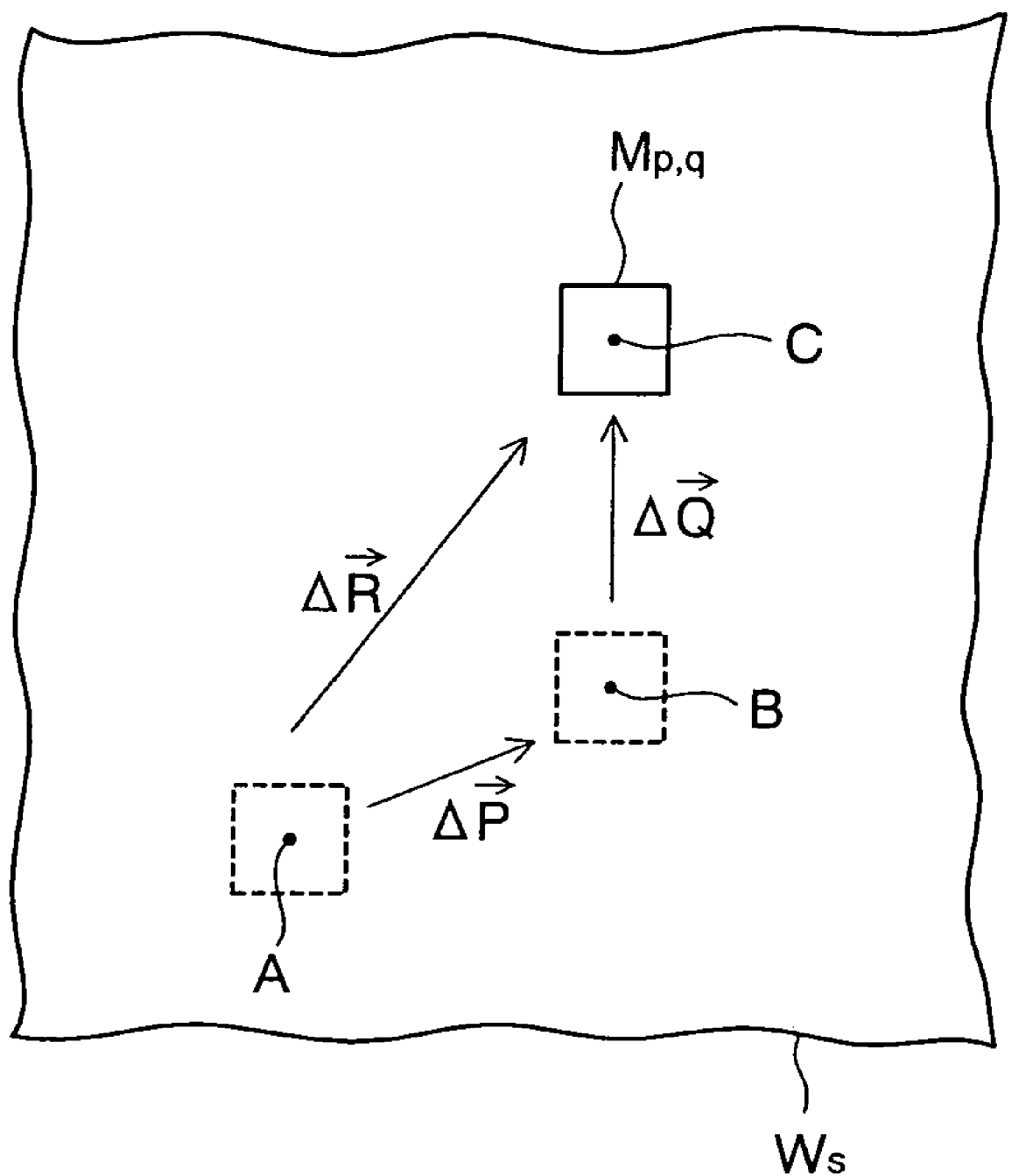
FIG. 3 is a plan view of the standard wafer according to the conventional example which is placed on a wafer stage.
Figure 4:
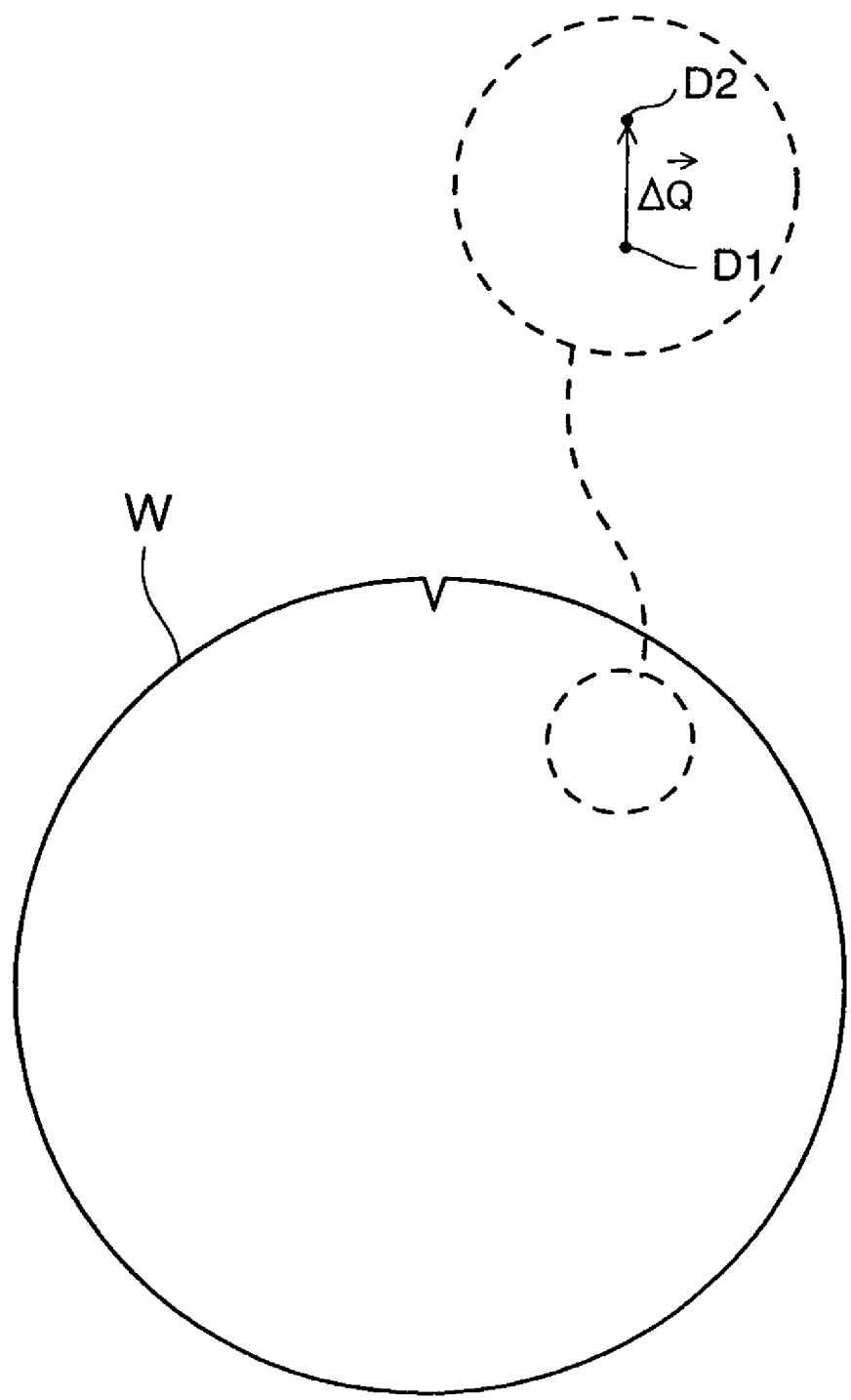
FIG. 4 is a view showing distortion of a product wafer on the wafer stage in the conventional example.
Figure 5:
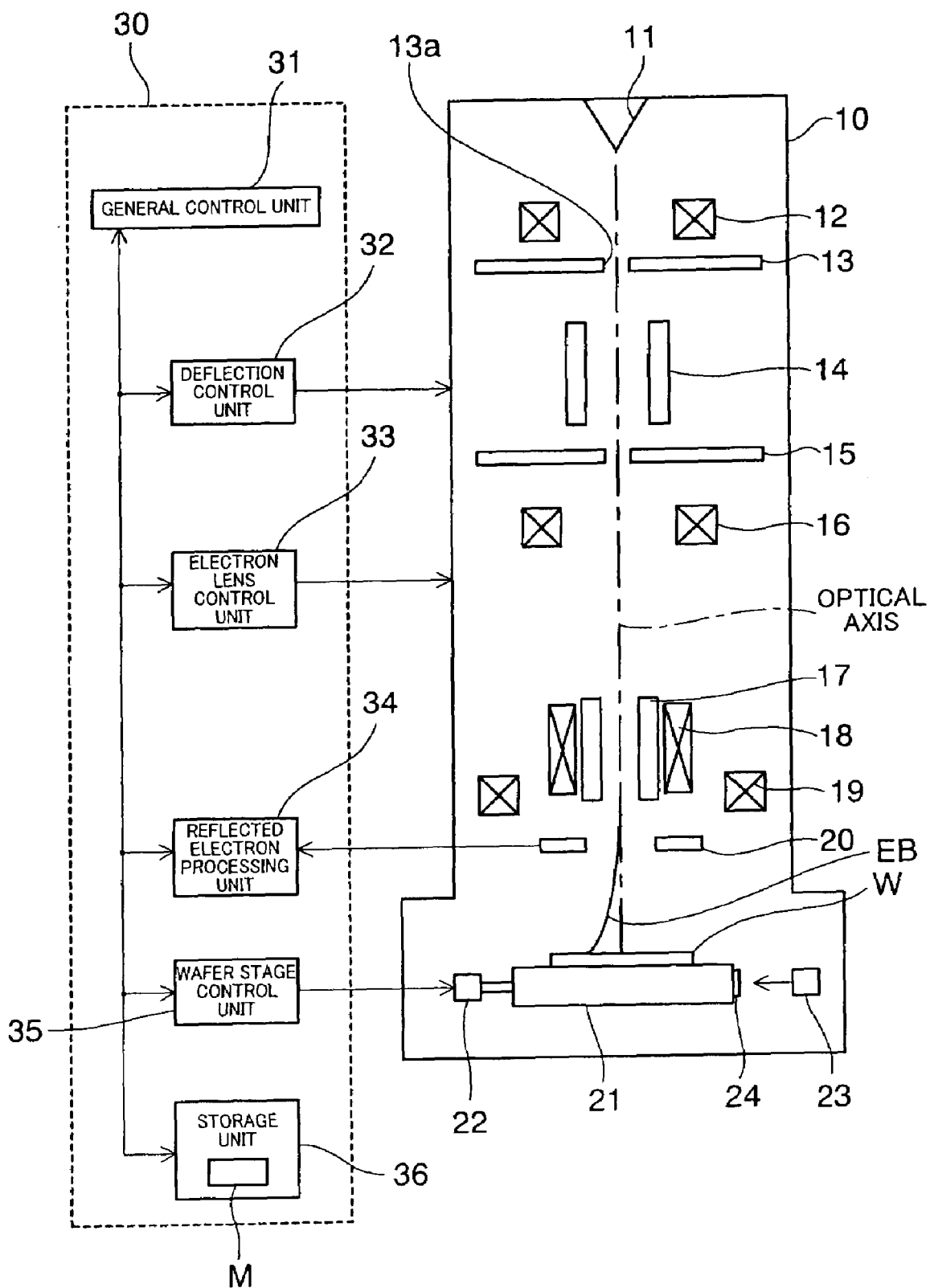
FIG. 5 is a block diagram of an electron beam photolithography machine (a charged particle beam photolithography machine) according to an embodiment of the present invention.

FIG. 5 is a block diagram of an electron beam photolithography machine (a charged particle beam photolithography machine) according to an embodiment of the present invention.

This photolithography machine includes a housing 10 which can reduce pressure inside, and an electron gun 11 which is a source of an electron beam EB is provided inside this housing 10. The electron beam EB is passed through a first electron lens 12, and is then formed into a rectangular shape by a slit 13a of a slit plate 13, for example. The electron beam EB is projected on a wafer W at predetermined magnification by second and third electron lenses 16 and 19.

A position on the wafer W where the electron beam is projected is rendered variable by moving a wafer stage (a substrate table) 21 by a motor 22 or deflecting the beam EB by a main deflector 18 or a sub deflector 17.

The main deflector 18 is configured to deflect the electron beam EB with a static magnetic field generated by a coil. Although response speed becomes slightly slow due to a hysteresis of the magnetic field, the main deflector 18 has an advantage of providing a large amount of deflection. On the contrary, the sub deflector 17 is configured to deflect the electron beam EB with an electrostatic field. Although an amount of deflection is small, the sub deflector 17 has an advantage of faster response speed than the main deflector 18. Due to these characteristics, the main deflector 18 is used for deflection in a relatively large region called a sub field, while the sub deflector 17 is used for deflection in a shot region which is a small region in the sub field.

Meanwhile, when the electron beam EB is not irradiated on the wafer W such as before exposure, for example, the electron beam EB is deflected by applying a voltage to a blanking electrode 14 and is allowed to hit an aperture portion 15 so as not to be irradiated onto the wafer W.

Moreover, the wafer stage 21 is moved laterally of the illustration sheet by the motor 22. Then, a laser is irradiated from an optical interferometer 23 to a mirror 24, and a position of the wafer stage 21 is measured by measuring reflected light with the optical interferometer 23. Actually, in addition to these constituents, there are also another motor for moving the wafer stage 21 perpendicularly to the illustration sheet and another optical interferometer for measuring the position of the wafer stage 21 in terms of this direction. However, the description of these constituents will be omitted herein.

When performing correction of the photolithography machine, for example, the position of the wafer stage 21 is measured as described above while a reflected electron from the wafer W is measured by use of a reflected electron detector 20 provided thereabove, whereby the position on the wafer W where the electron beam EB is irradiated is measured.

This electron beam photolithography machine is controlled by a control unit 30. Moreover, this control unit 30 is broadly divided into a general control unit 31, a deflection control unit 32, an electron lens control unit 33, a reflected electron processing unit 34, a wafer stage control unit 35, and a storage unit 36.

Among these units, the general control unit 31 is a workstation, for example, which controls the respective units 32 to 36 mentioned above.

The deflection control unit 32 controls voltages to be applied to the blanking electrode 14 and the sub deflector 17, and an amount of current to the main deflector 18 to set the desired amount of deflection of the electron beam EB. The electron lens control unit 33 focuses the electron beam EB on the wafer W or adjusts the magnification by controlling amount of currents to the first to third electron lenses 12, 16, and 19.

Meanwhile, the reflected electron processing unit 34 detects an electric signal from the reflected electron detector 20 and notifies the general control unit 31 of the electric signal. Then, the wafer stage control unit 35 moves the wafer stage 21 to a predetermined position by driving the motor 22.

Moreover, the storage unit 36 is made of a hard disk, for example, and is configured to store a correction map M which is used for correction to be described later.

(2) Standard Wafer and Forming Method Thereof

Next, a standard wafer used for correcting this electron beam photolithography machine and a method of forming the standard wafer will be described. Here, the reason for calling the substrate as the standard substrate is that misalignment factors caused in an actual process will be corrected based on misalignment data obtained by use of this standard wafer.

Figure 6:
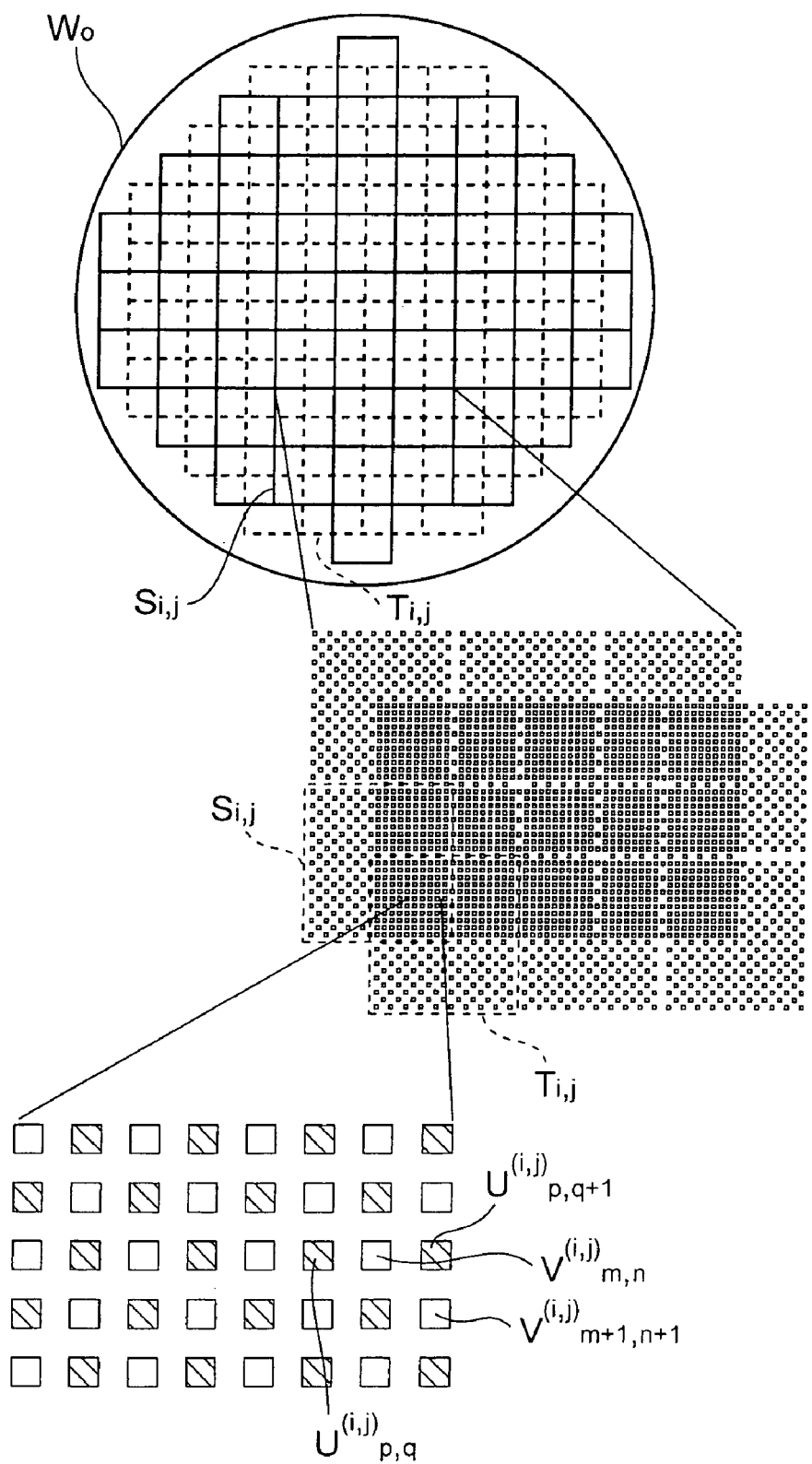
FIG. 6 is a plan view of a standard wafer used in the embodiment of the present invention.

FIG. 6 is a plan view of a standard wafer $W_0$. Chip-shaped first mark groups Si,j arranged in a matrix as illustrated with solid lines are formed on this standard wafer $W_0$. In addition, second marks groups Ti,j shifted by a half chip size upward and to the right from the first mark groups Si,j are formed as illustrated with dashed lines. Here, the suffixes i and j in the groups Si,j and Ti,j mean an i-th row and a j-th column, respectively.

Marks Up,q arranged in a matrix are further formed in each of the first mark groups Si,j. The marks will be hereinafter indicated as $U^{(i,j)}_{p,q}$. Similarly, marks Vm,n in each of the second mark groups Ti,j will be hereinafter indicated as $V^{(i,j)}_{m,n}$.

The layouts of the respective mark groups Si,j and Ti,j are not limited to the foregoing. It is also possible to obtain advantages to be described later only if the second mark groups Ti,j are overlaid on at least part of the first mark groups Si,j.

FIG. 7A to FIG. 7E are cross-sectional views showing a method of manufacturing the standard wafer $W_0$ on which the mark groups Si,j and Ti,j are formed.

Figure 7A:
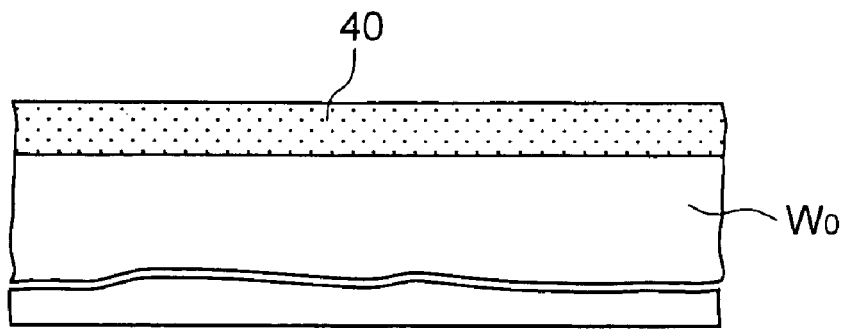
FIG. 7A to FIG. 7E are cross-sectional views sequentially showing processes in a method of manufacturing the standard wafer used in the embodiment of the present invention.

Firstly, as shown in FIG. 7A, a positive photoresist 40 is coated on a wafer (a substrate) $W_0$ made of silicon.

Figure 7B:
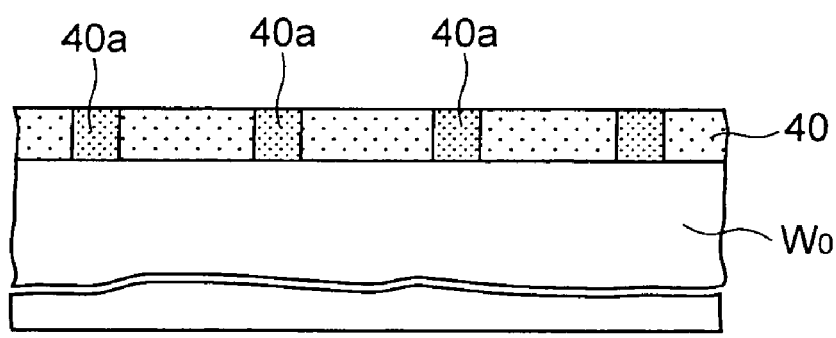

Next, a process for obtaining a cross-sectional structure shown in FIG. 7B will be described. Firstly, a portion of the photoresist 40 corresponding to the first mark groups Si,j is exposed for each chip by a step and repeat process using reticle for projecting one first mark group Si,j using a stepper (not shown). In this way, first light-exposed portions 40a corresponding to the first marks $U^{(i,j)}_{p,q}$ constituting the first mark group Si,j are formed on the photoresist 40.

Figure 8:
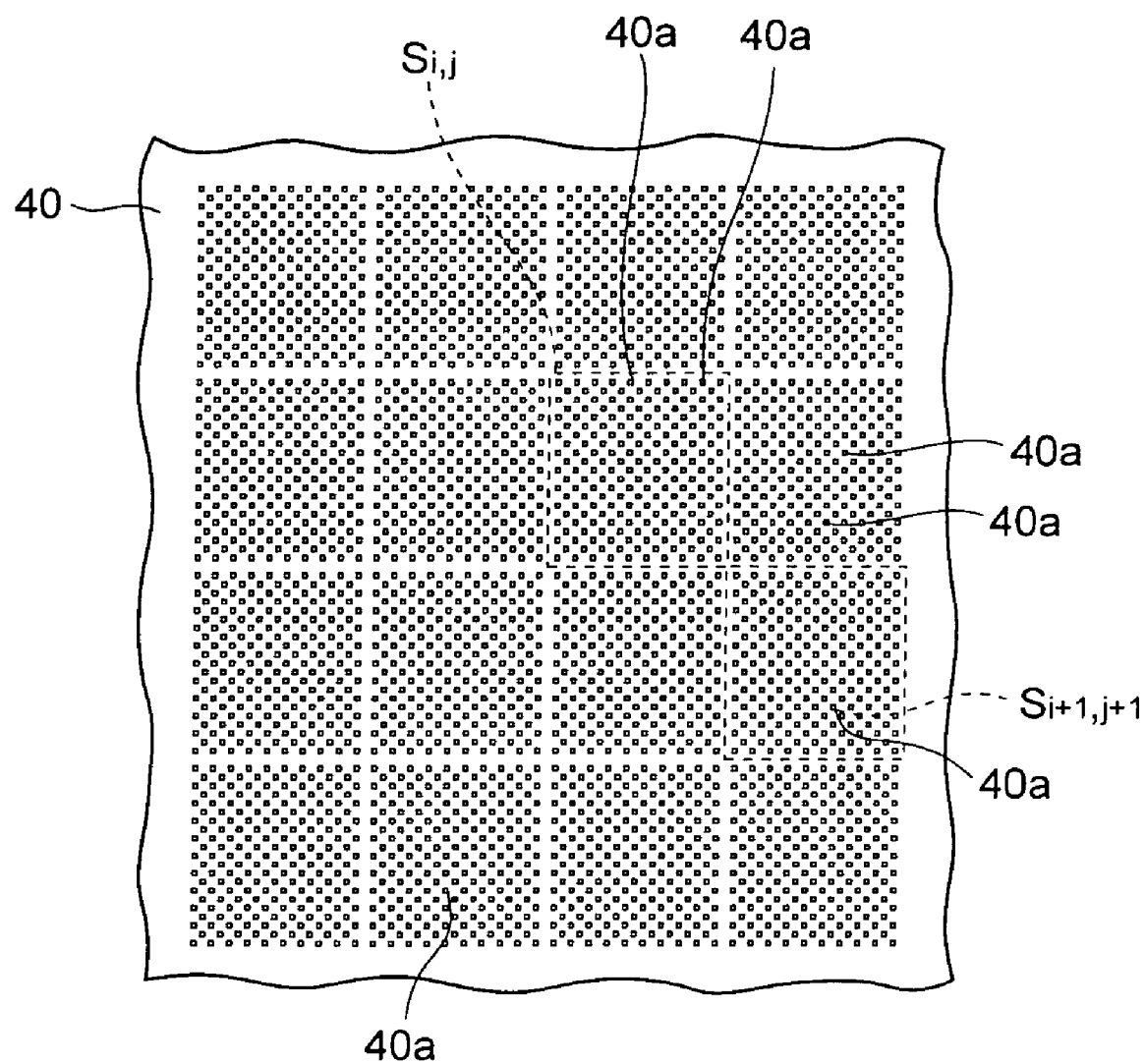
FIG. 8 is a plan view (No. 1) showing the method of manufacturing the standard wafer used in the embodiment of the present invention.

FIG. 8 is a plan view after completing the exposure process. As shown in the drawing, the plurality of the first light-exposed portions 40a having the same planar shapes as the first marks $U^{(i,j)}_{p,q}$ are formed on the photoresist 40 for each of the first mark groups Si,j.

Figure 7C:
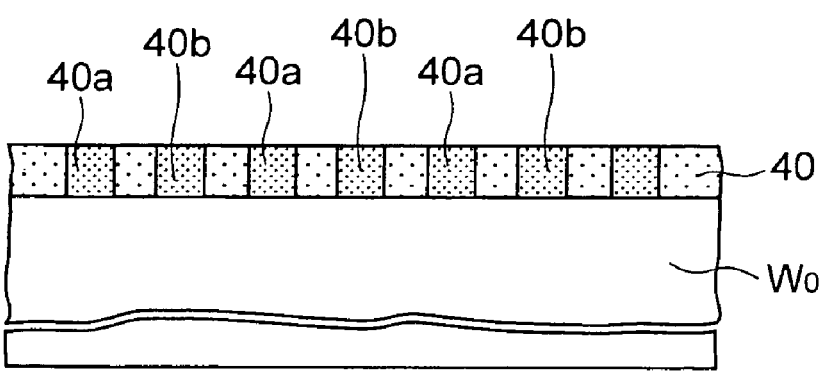

Subsequently, as shown in FIG. 7C, the photoresist 40 is subjected to exposure again by use of the same stepper and the same reticle in the foregoing step while adjusting a feeding amount of the wafer such that one shot is overlaid on the shot taken in FIG. 7B. In this way, portions of the photoresist 40 corresponding to the second marks $V^{(i,j)}_{m,n}$ constituting the second mark groups Ti,j are exposed and formed into second light-exposed portions 40b.

Figure 9:
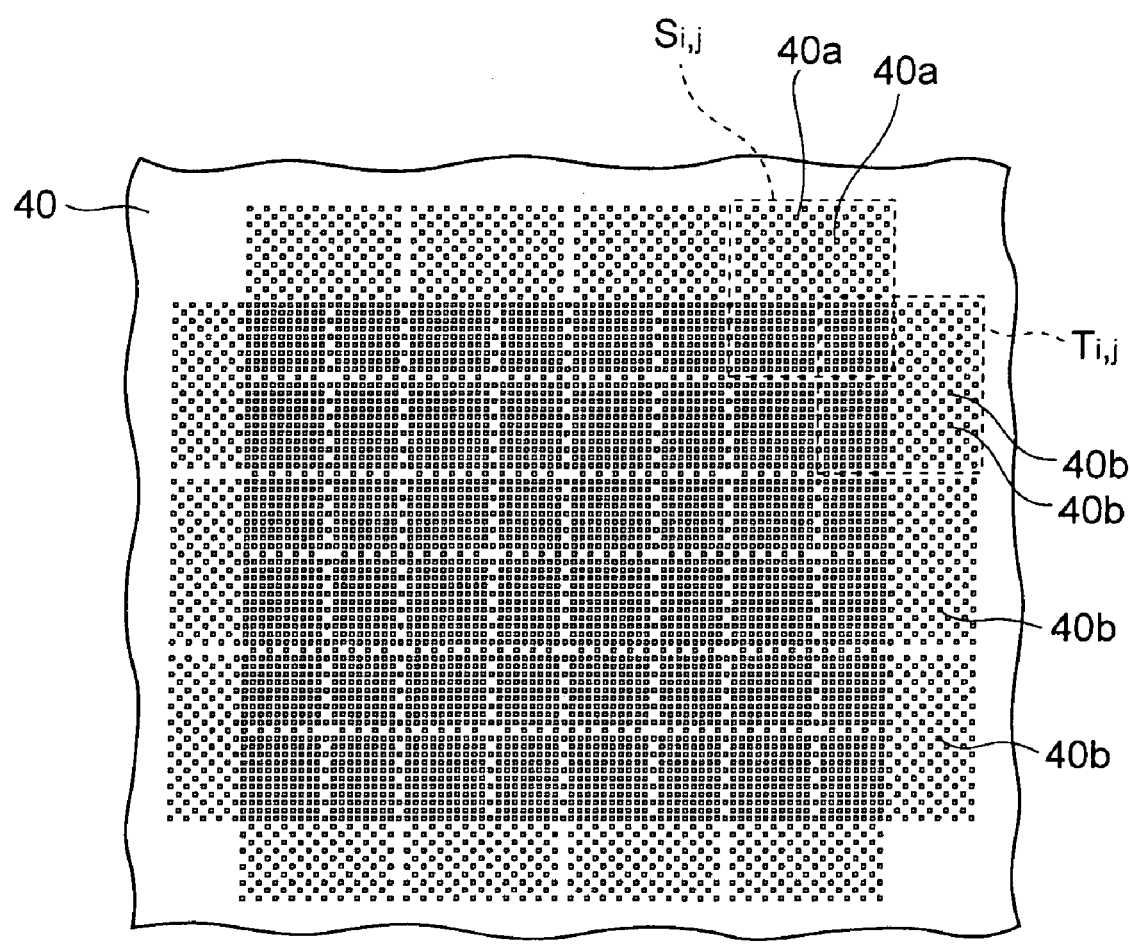
FIG. 9 is a plan view (No. 2) showing the method of manufacturing the standard wafer used in the embodiment of the present invention.

FIG. 9 is a plan view showing a state after completing this exposure step. As shown in the drawing, the plurality of the second light-exposed portions 40b having the same planar shapes as the second marks $V^{(i,j)}_{m,n}$ constituting the second mark groups Ti,j are formed on the photoresist 40 so as to break into spaces between the respective first light-exposed portions 40a.

Figure 7D:
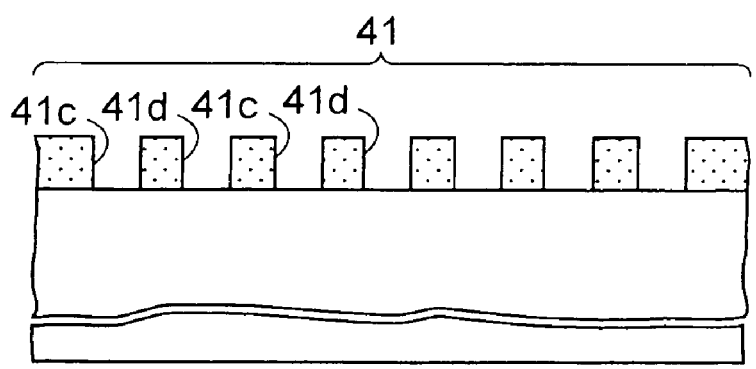

Next, as shown in FIG. 7D, the first and second light-exposed portions 40a and 40b are removed by developing the photoresist 40, and the remaining portions of the photoresist 40 are formed into a resist pattern 41. Here, a plurality of first windows 41c corresponding to the first marks $U^{(i,j)}_{p,q}$ and a plurality of second windows 41d corresponding to the second marks $V^{(i,j)}_{m,n}$ will be formed on the resist pattern 41.

Figure 7E:
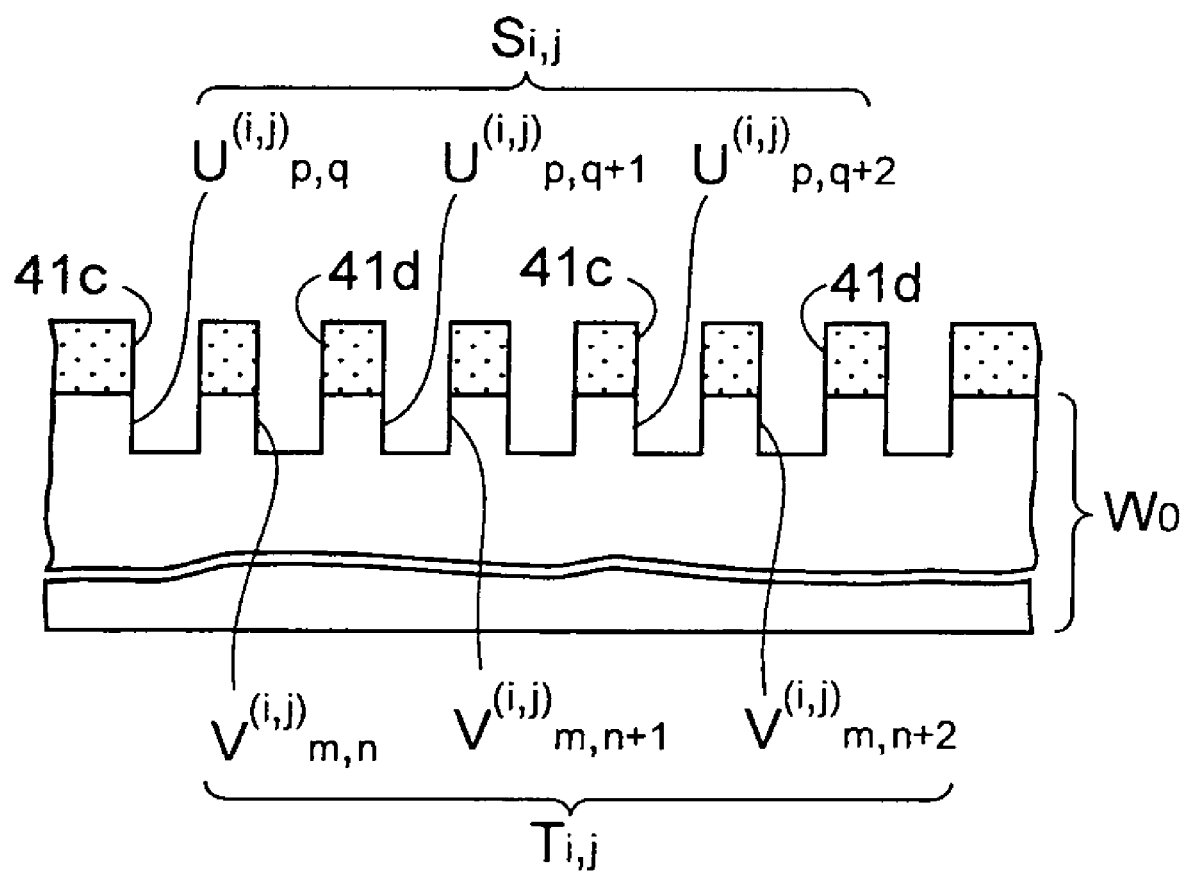

Subsequently, as shown in FIG. 7E, the wafer $W_0$ is subjected to dry etching while using the resist pattern 41 as a mask. In this way, the first marks $U^{(i,j)}_{p,q}$ are formed on the wafer $W_0$ below the first windows 41c and the second marks $V^{(i,j)}_{m,n}$ are formed on the wafer $W_0$ below the second windows 41d. Although the depths of the respective marks $U^{(i,j)}_{p,q}$ and $V^{(i,j)}_{m,n}$ are not particularly limited, the depths will be set to 100 nm in this embodiment, for example.

Then, the first marks $U^{(i,j)}_{p,q}$ constitute the first mark group Si,j and the second marks $V^{(i,j)}_{m,n}$ constitute the second mark group Ti,j. Thereafter, the resist pattern 41 is removed.

In this way, the standard wafer $W_0$ including the first mark groups Si,j and the shifted second mark groups Ti,j is formed.

(3) Method of Forming Correction Map

Next, a method of forming the correction map, which is necessary for correction of the electron beam photolithography machine shown in FIG. 5, by use of the above-described standard wafer $W_0$ will be described.

Figure 10A:
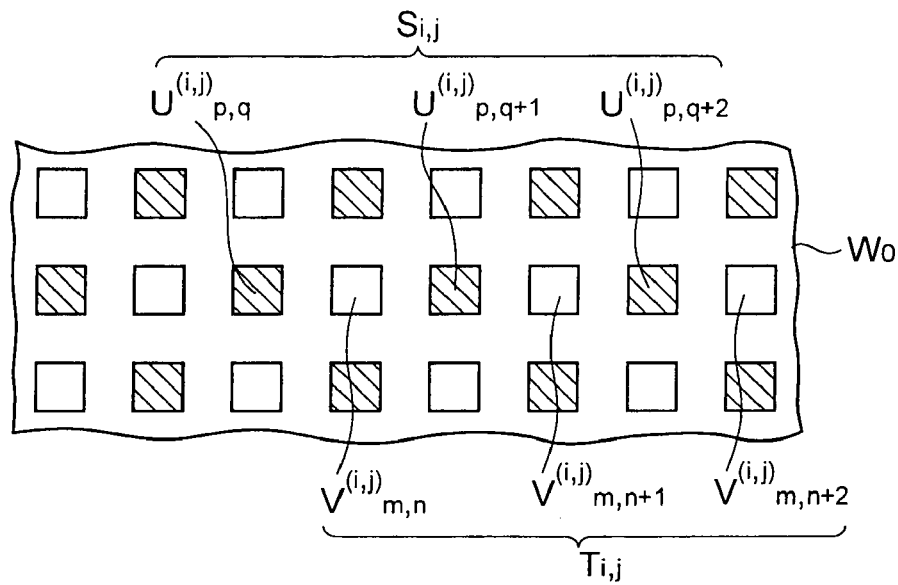
FIG. 10A and FIG. 10B are plan views showing an aspect of misalignment factors of mark groups on the standard wafer attributable to an error of a stepper or distortion of a wafer stage.

FIG. 10A is an enlarged plan view of the standard wafer $W_0$ in the state where the standard wafer $W_0$ formed as described above is placed on the wafer stage 21 (see FIG. 5). It is to be noted, however, that this drawing shows the state where the aforementioned stepper to be used in the FIG. 7B and FIG. 7C does not have any errors and the wafer stage 21 does not bear any distortion or dust thereon.

In this case, since the stepper does not have any errors, the respective mark groups Si,j and Ti,j are formed in designed positions on the standard wafer $W_0$. Moreover, since the wafer stage 21 does not bear any distortion or dust, when the standard wafer $W_0$ is placed on the wafer stage 21 as described in the drawing, the respective mark groups Si,j and Ti,j exist in the designed positions on the standard wafer $W_0$ as similar to the state before placing the wafer $W_0$ thereon.

Figure 10B:
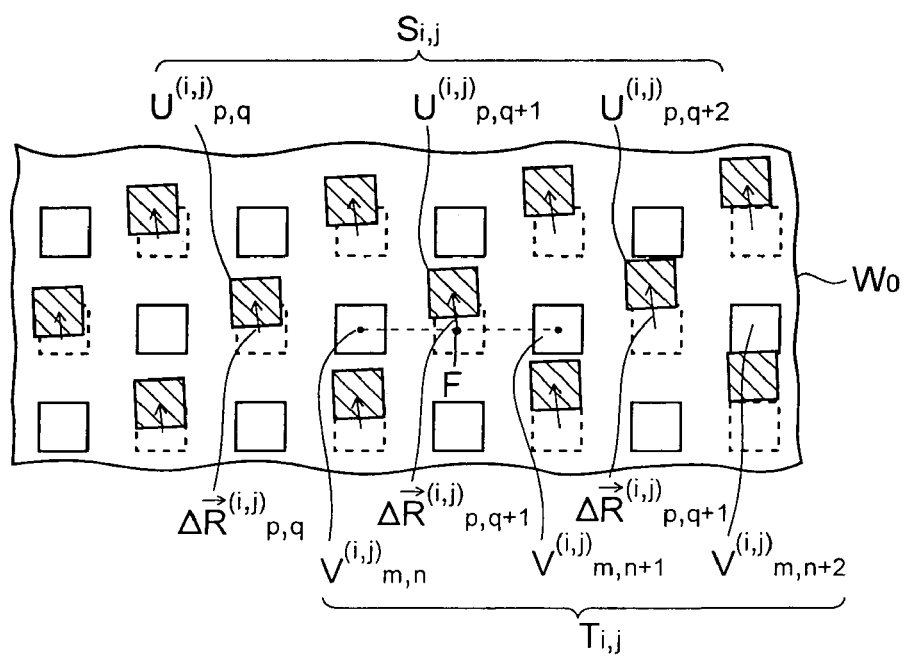

On the contrary, FIG. 10B is a plan view showing the case where the stepper has an error such as an error concerning wafer feeding accuracy in the step and repeat process.

In this case, the respective mark groups Si,j and Ti,j are not formed in the targeted positions due to the error of the stepper. Accordingly, the second marks $V^{(i,j)}_{m,n}$ on the m-th row and the first marks $U^{(i,j)}_{p,q}$ on the p-th row, which are supposed to be aligned on the same row, are deviated as shown in the drawing. Moreover, depending on the orientation of the error, the mark groups Si,j and Ti,j may be deviated from each other not only in terms of the row but also in terms of the column.

A similar phenomenon to the foregoing may also occur when the wafer stage 21 bears distortion or dust. As described above, in an actual manufacturing process, both of the error attributable to the stepper and the error attributable to the wafer stage become apparent.

Therefore, it is possible to detect the error of the stepper, distortion of the wafer stage 21, and the dust on the wafer stage 21 by adopting the second marks $V^{(i,j)}_{m,n}$ as positional standards and measuring how much the first marks $U^{(i,j)}_{p,q}$ are deviated from the second marks $V^{(i,j)}_{m,n}$.

Accordingly, in this embodiment, the electron beam EB is irradiated onto the standard wafer $W_0$ without deflection, and the reflected electrons reflected by edge portions of the respective marks $V^{(i,j)}_{m,n}$ and $U^{(i,j)}_{p,q}$ are detected by the reflected electron detector 20 (see FIG. 5) while moving the stage 21. In this way, in terms of a coordinate system arbitrarily set on the wafer stage 21, positional coordinates of the respective marks $V^{(i,j)}_{m,n}$ and $U^{(i,j)}_{p,q}$ on the entire surface of the wafer are specified.

Subsequently, error vectors (the misalignment factors) $\Delta R^{(i,j)}_{p,q}$ of the first marks $U^{(i,j)}_{p,q}$ indicating misalignment from the original positions thereof are calculated in terms of the entire surface of the wafer by use of the positional coordinates of the second marks $V^{(i,j)}_{m,n}$ as the standards. The method of calculation used herein is not particularly limited. For example, when calculating the vector $\Delta R^{(i,j)}_{p,q+1}$, a middle point F of a line connecting the second marks $V^{(i,j)}_{m,n}$ and $V^{(i,j)}_{m,n+1}$ located on both sides is calculated by use of the positional coordinates thereof, and the middle point may be adopted as an initial point (a virtual position of the first mark $U^{(i,j)}_{p,q+1}$ without misalignment) of the vector $\Delta R^{(i,j)}_{p,q+1}$ while actual positional coordinates of the first mark $U^{(i,j)}_{p,q+1}$ may be adopted as a terminal point of the vector $\Delta R^{(i,j)}_{p,q+1}$.

Thereafter, the positions of the respective points on the wafer stage 21 are expressed by the above-described (i,j; p,q), and the correction map M formed by pairs of the respective points and the above-described error vectors $\Delta R^{(i,j)}_{p,q}$ in those points is stored in the storage unit 36 of the control unit 30 shown in FIG. 5.

FIG. 11 is a table schematically showing the correction map M.

As described above, the error vectors $\Delta R^{(i,j)}_{p,q}$ constituting the correction map M can be obtained by use of the reflected electrons from the electron beam EB. This method does not require an optical coordinate measuring instrument unlike the conventional example. Accordingly, it is possible to reduce costs for forming the correction map M as compared to the conventional example.

(4) Method of Manufacturing Electronic Device

Next, a method of manufacturing an electronic device capable of eliminating misalignment errors attributable to the stepper or the wafer stage by use of the correction map M formed in the foregoing process will be described.

FIGS. 12A to 12F are cross-sectional views sequentially showing processes in a method of manufacturing an electronic device according to this embodiment.

Figure 12A:
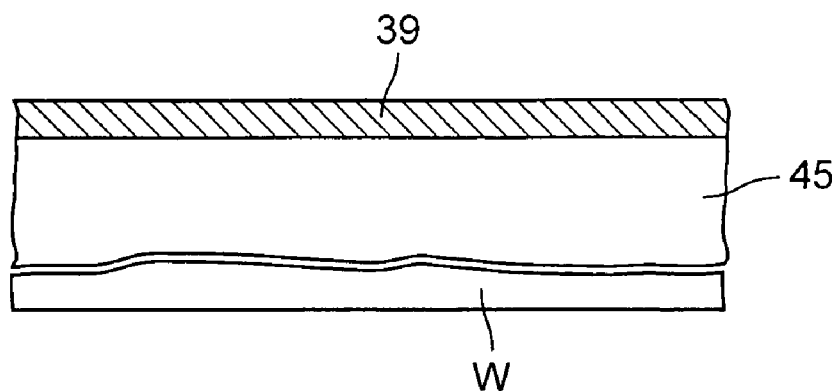
FIG. 12A to FIG. 12F are cross-sectional views sequentially showing processes in a method of manufacturing an electronic device according to the embodiment of the present invention.

To begin with, a process for obtaining a cross-sectional structure shown in FIG. 12A will be described.

Firstly, unillustrated MOS transistors and the like are formed on a product wafer (a product substrate) W which is made of silicon. Then, a silicon dioxide film is formed in a thickness from about 500 to 1000 nm in accordance with the CVD method as a first interlayer insulating film 45 for covering the transistors. Next, an aluminum film is formed in a thickness from about 500 to 1000 nm on the first interlayer insulating film 45 to form a metal film 39.

Figure 12B:
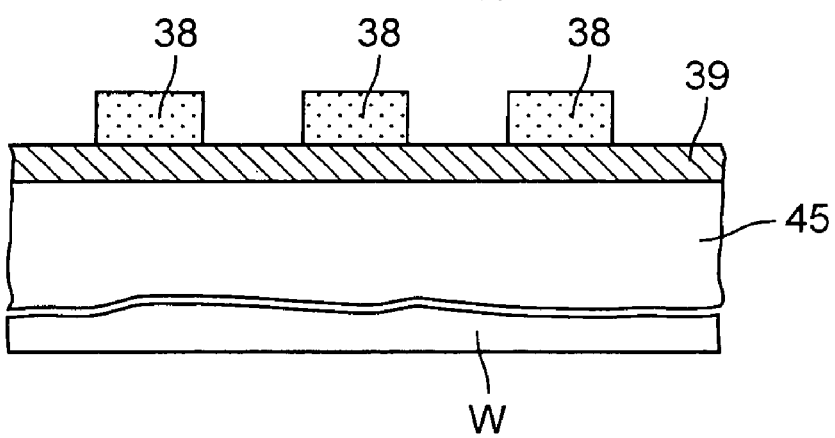

Next, a process for obtaining a cross-sectional structure shown in FIG. 12B will be described. Firstly, a photoresist is coated on the metal film 39. Then, the same stepper used for forming the standard wafer $W_0$, i.e. the stepper used in the processes in FIG. 7B and FIG. 7C is used to expose the photoresist. Thereafter, a first resist pattern 38 is formed by developing the photoresist.

Figure 12C:
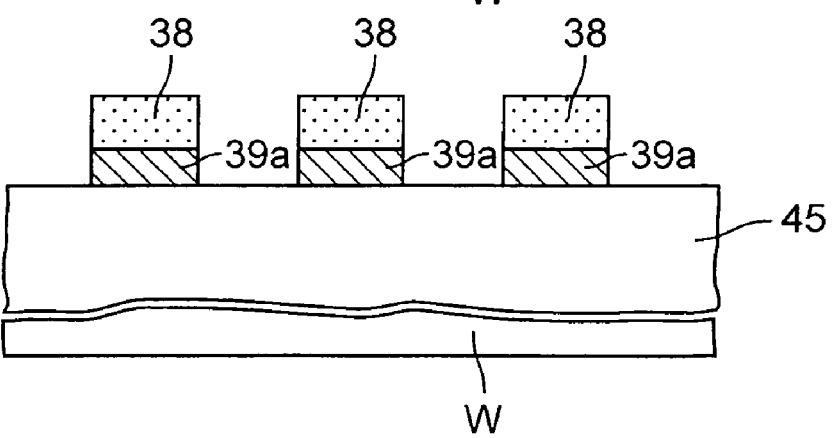

Next, as shown in FIG. 12C, the metal film 39 is subjected to etching while using the first resist pattern 38 as a mask and is formed into a wiring pattern (a first pattern) 39a. Thereafter, the first resist pattern 38 is removed.

Figure 12D:
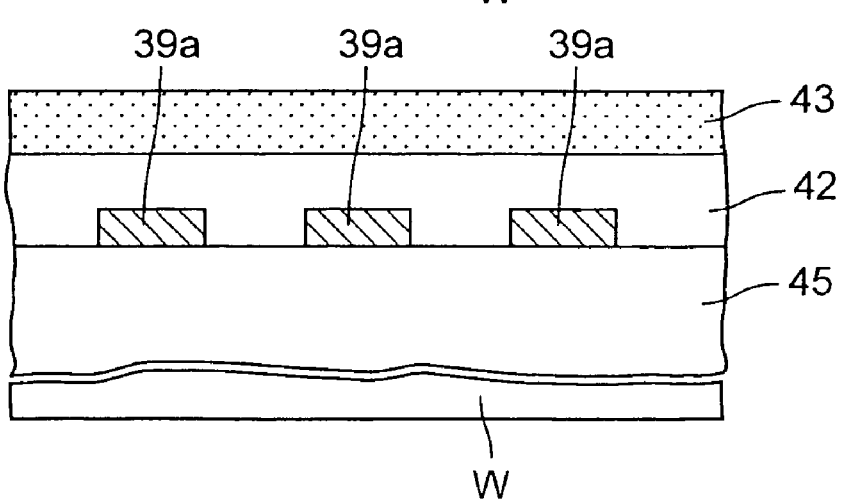

Subsequently, as shown in FIG. 12D, a silicon dioxide film for covering the wiring pattern 39a is formed in accordance with the CVD method, and then an upper surface thereof is planarized to form a second interlayer insulating film 42 in a thickness from about 500 to 1000 nm on the first interlayer insulating film 45.

Thereafter, a photoresist 43 is coated on this second interlayer insulating film 42.

Figure 12E:
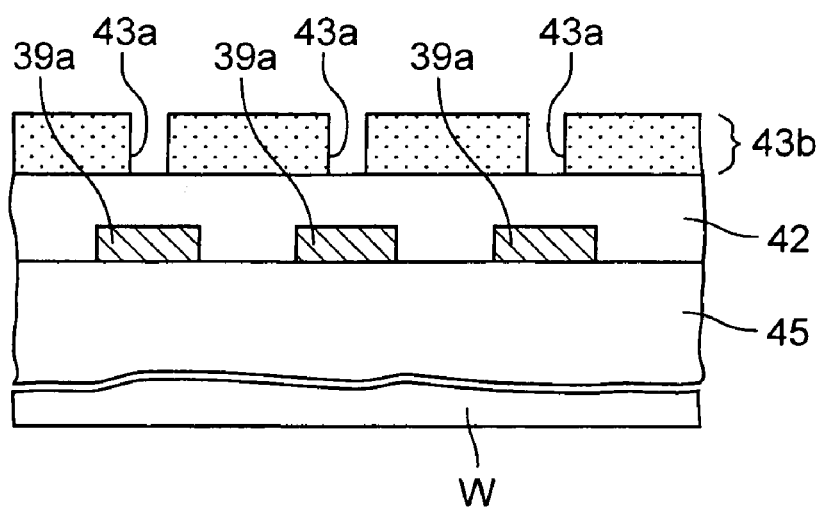

Next, a process for obtaining a cross-sectional structure shown in FIG. 12E will be described.

Firstly, the product wafer W is placed on the wafer stage 21 shown in FIG. 5, and the inside of the housing 10 is reduced to a predetermined pressure. Then, the deflection control unit 32 (see FIG. 5) makes reference to the correction map M in the storage unit 36 and exposure of the photoresist 43 is performed while correcting the amount of deflection depending on each of the points on the product wafer W. For example, when irradiating the electron beam EB onto the position (i,j; p,q), the electron beam EB is deflected by adding the amount of deflection corresponding to the above-described error vector $\Delta R^{(i,j)}_{p,q}$ to the amount of deflection for the relevant position (i,j; p,q). In this way, it is possible to eliminate the misalignment factor caused in the actual process by using correction amount data obtained in advance by use of the standard wafer $W_0$.

Here, the deflection may be achieved by use of the main deflector 18 or the sub deflector 17 shown in FIG. 5.

Subsequently, a second resist pattern 43b including windows 43a is formed on the wiring pattern 39a by developing the photoresist 43. As described above, the windows 43a are aligned with the wiring pattern 39a as targeted by adding correction to the amount of deflection of the electron beam EB.

Figure 12F:
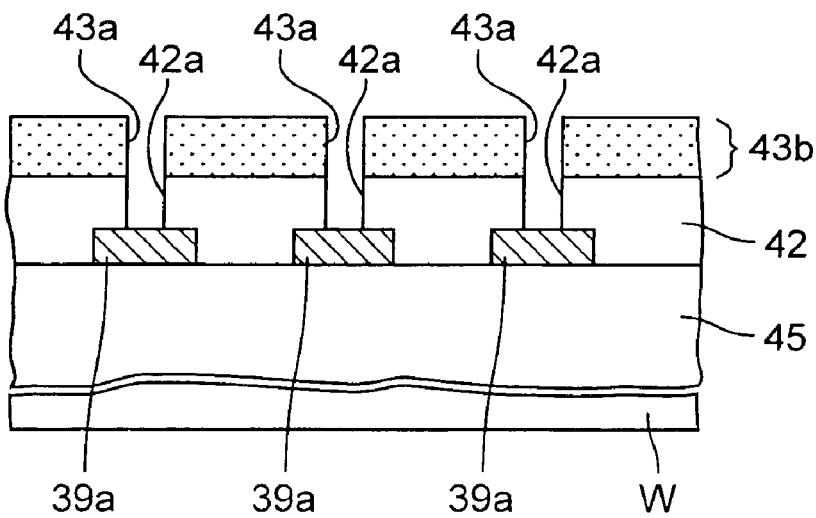

Then, as shown in FIG. 12F, the second interlayer insulating film 42 is etched through the windows 43a. In this way, the second interlayer insulating film 42 including holes 42a having sufficient depths to reach wiring pattern 39a is formed. Thereafter, the second resist pattern 43b is removed.

Subsequently, conductive plugs are formed inside the holes 42a and an upper-layer wiring pattern is formed thereon. However, the details of these processes will be omitted herein.

According to the above-described method of manufacturing an electronic device of this embodiment, the same stepper used for forming the standard wafer $W_0$ is used as the stepper for forming the wiring pattern 39a by photolithography. Moreover, reference is made to the correction map M obtained by the standard wafer $W_0$, and the photoresist 43 is exposed while correcting the amount of deflection of the electron beam EB to form the second resist pattern 43b.

In this way, the error caused in the wiring pattern 39a attributable to the stepper, such as deviation between the chips caused due to the feeding error of the product wafer W by the stepper, is reflected to the amount of deflection of the electron mean EB. Accordingly, the second resist pattern 43b is formed to include such deviation intentionally.

Therefore, even if the wiring pattern 39a bears the error for each chip attributable to the stepper, the second resist pattern 43b is formed to include the same error. As a result, it is possible to overlay the wiring pattern 39a on the second resist pattern 43b in one chip as designed.

Moreover, the error attributable to distortion of the wafer stage 21 is also reflected to the correction map M. Accordingly, it is also possible to prevent the wiring pattern 39a from being deviated from the second resist pattern 43b due to the wafer stage 21.

As described above, in this embodiment, it is possible to overlay the layer patterned by use of the same stepper as the one used for forming the standard wafer $W_0$ on the layer patterned by use of the above-described electron beam photolithography machine desirably while avoiding misalignment of these layers.

In the above-described embodiment, the wiring pattern 39a is formed by use of the stepper while the holes 42a are formed on the second interlayer insulating film 42 by use of the electron beam photolithography machine. However, the embodiment is not limited only to foregoing, and it is also possible to form the wiring pattern (the first pattern) 39a by patterning the metal layer (a first film) 39 with the electron beam photolithography machine and to form the holes 42a by patterning the second interlayer insulating film (a second film) 42 with the stepper.

In addition, although the electronic device is fabricated by use of the product wafer W made of silicon in the above-described embodiment, it is also possible to apply the embodiment to other electronic devices such as superconductive integrated circuits instead of the above-described electronic device.

(5) Classification of Causes of Errors

The method of forming the correction map (Section (3)) and the method of manufacturing the electronic device (Section (4)) using the correction method are configured only to obtain the error vectors $\Delta R^{(i,j)}_{p,q}$ constituting the correction map M. However, according to the present invention, it is also possible to classify the causes of the error vectors $\Delta R^{(i,j)}_{p,q}$ by analyzing distribution of the error vectors $\Delta R^{(i,j)}_{p,q}$ in the plane of the wafer. This method will be described below.

Figure 13:
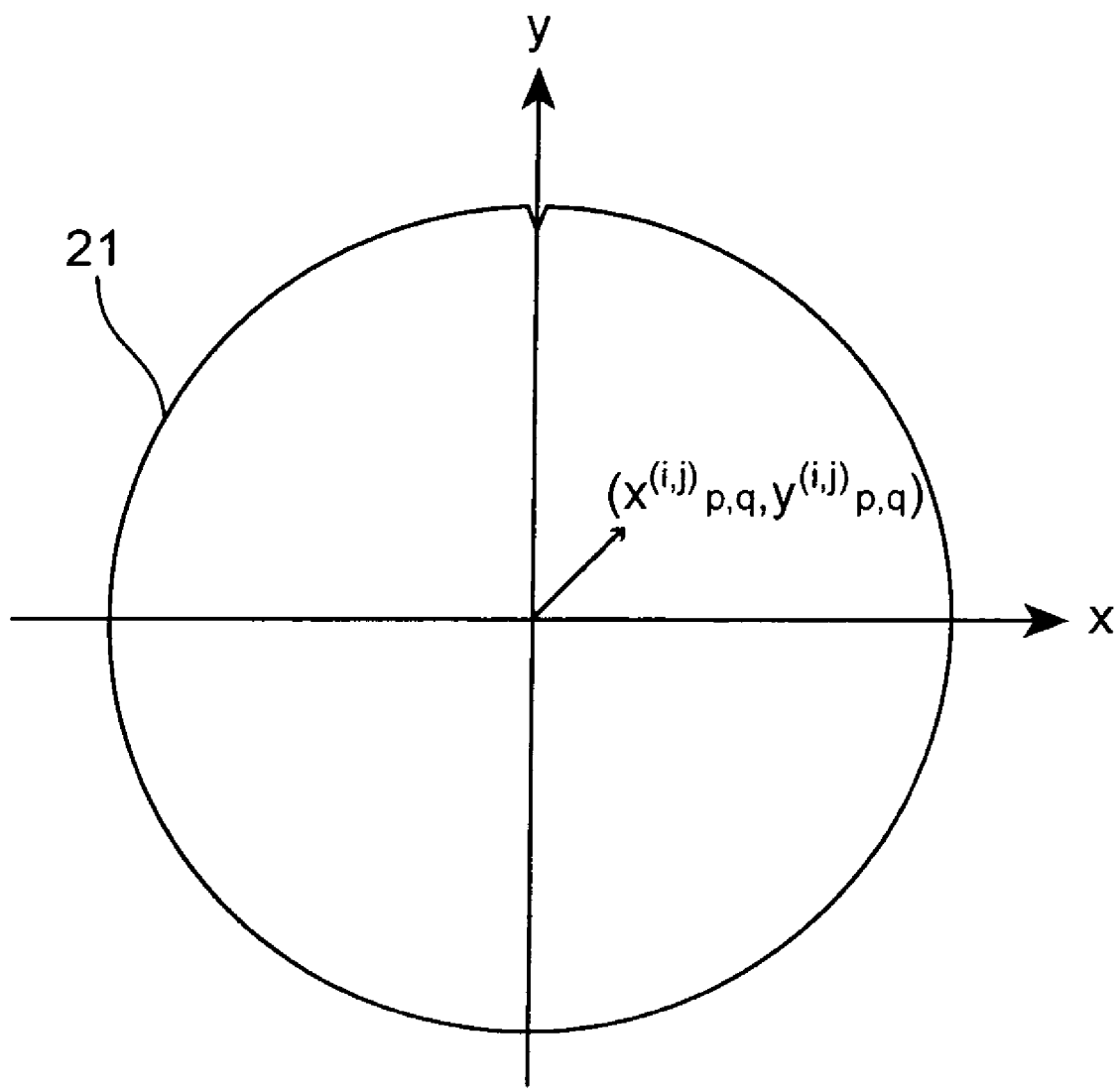
FIG. 13 is a plan view showing a coordinate system to be introduced to a wafer when extracting components of error vectors in the embodiment of the present invention.

First of all, a coordinate system as shown in FIG. 13 is introduced to the wafer stage 21. In this coordinate system, a point in the wafer stage 21 is expressed by $(x^{(i,j)}_{p,q}, y^{(i,j)}_{p,q})$. The suffixes i,j; p,q are the same as those used for defining the error vectors $\Delta R^{(i,j)}_{p,q}$. Specifically, (i,j) indicates the position of the chip in the wafer, and (p,q) indicates the position of the point in the chip. Therefore, $x^{(i,j)}_{p,q}$ indicates the position of the point on the p-th row and on the q-th column in the chip on the i-th row and on the j-th column.

Moreover, to simplify the expression, a code n will be used as a collective index of i,j; p,.q (i.e. n:=(i,j; p,q)).

Now, an error vector $\Delta Rn$ and its x component and y component will be defined as follows:

$$\Delta Rn := \Delta R^{(i,j)}_{p,q} = (F_x(x_n, y_n), F_y(x_n, y_n)) \quad (1)$$

As described previously, $\Delta Rn$ includes the component attributable to the wafer stage 21 and the component attributable to the error of the stepper. Of these components, the former component is generated due to distortion of the wafer stage 21 or dust on the wafer stage 21. Accordingly, this component is considered to be continuously variable in the plane of the wafer W. Therefore, this component (a first unknown function) will be expressed as follows:

$$(f_x(x_n, y_n), f_y(x_n, y_n)) \quad (2)$$

Meanwhile, in terms of $\Delta Rn$, the component attributable to the stepper such as rotation of the chip is not relevant to the position of the chip. Accordingly, this component repeatedly occurs in all the chips. Therefore, it is conceivable that this component does not depend on the position of the chip (that is, (i,j)) in the wafer, but depends only on the position in the chip, that is, (p,q). Hence, the origin of the (p,q) coordinates will be defined as (0,0), and a local coordinate system (Xn,Yn) in one chip is introduced as follows:

$$X_n' := X^{(i,j)}_{p,q} := x^{(i,j)}_{p,q} - x^{(i,j)}_{0,0};\text{ and}$$

$$Y_n' := Y^{(i,j)}_{p,q} := y^{(i,j)}_{p,q} - y^{(i,j)}_{0,0}$$

Moreover, the component generated in ΔRn due to the error of the stepper (a second unknown function) will be defined as:

$$(g_x(X_n, Y_n), g_y(X_n, Y_n)) \quad (3)$$

Among the above-described formulae (1) to (3), the formula (1) represents an amount obtained by actual measurement as described previously. On the other hand, formulae (2) and (3) represent the unknown functions.

Accordingly, the following variations will be considered to obtain functional forms of the formulae (2) and (3) in accordance with the least square method applying the formula (1) as an observed value:

$$\begin{cases} 0 = \dfrac{\delta}{\delta f_x} \sum_{n=\text{all points on wafer}} \{F_x(x_n, y_n) - f_x(x_n, y_n) - g_x(X_n, Y_n)\}^2 \\ 0 = \dfrac{\delta}{\delta f_y} \sum_{n=\text{all points on wafer}} \{F_y(x_n, y_n) - f_y(x_n, y_n) - g_y(X_n, Y_n)\}^2 \\ 0 = \dfrac{\delta}{\delta g_x} \sum_{n=\text{all points on wafer}} \{F_x(x_n, y_n) - f_x(x_n, y_n) - g_x(X_n, Y_n)\}^2 \\ 0 = \dfrac{\delta}{\delta g_y} \sum_{n=\text{all points on wafer}} \{F_y(x_n, y_n) - f_y(x_n, y_n) - g_y(X_n, Y_n)\}^2 \end{cases}$$

Now, $(f_x, f_y)$ and $(g_x, g_y)$ satisfying the condition that these variations become equal to 0 is obtained with a calculator. Eventually, the following approximations are obtained:

$$F_x(x_n, y_n) \leqq f_x(x_n, y_n) + g_x(X_n, Y_n);\text{ and}$$

$$F_y(x_n, y_n) \leqq f_y(x_n, y_n) + g_y(X_n, Y_n)$$

In this way, the error vector ΔRn is decomposed to the component $(f_x, f_y)$ attributable to the wafer stage 21 and the component $(g_x, g_y)$ attributable to the stepper.

Figure 14:
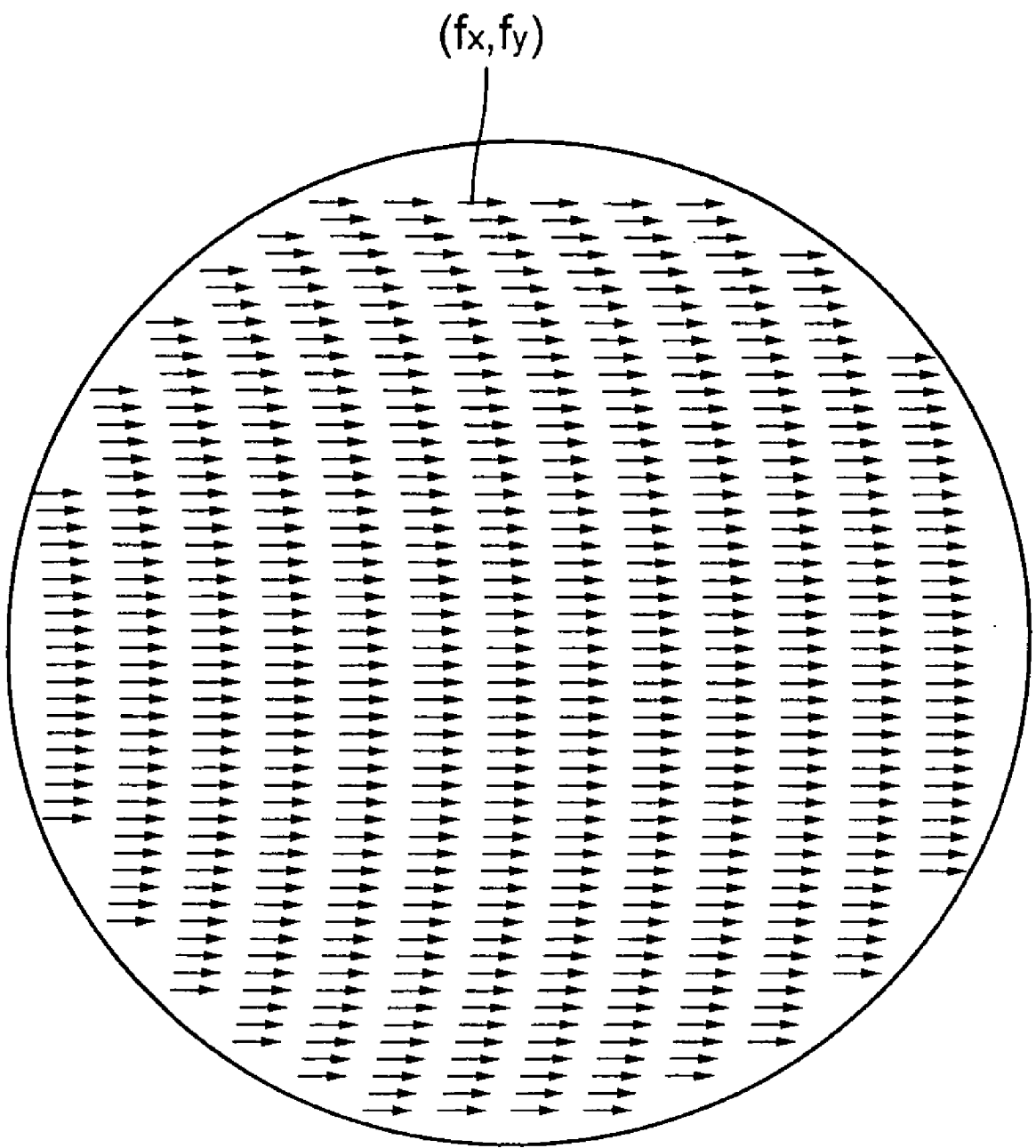
FIG. 14 is a plan view showing the components of the error vectors measured in the embodiment of the present invention, which are attributable to the wafer stage.

FIG. 14 is a plan view showing an example of distribution of $(f_x, f_y)$ in the plane of the wafer, which represents the distribution when the wafer stage 21 is distorted, for example.

Figure 15:
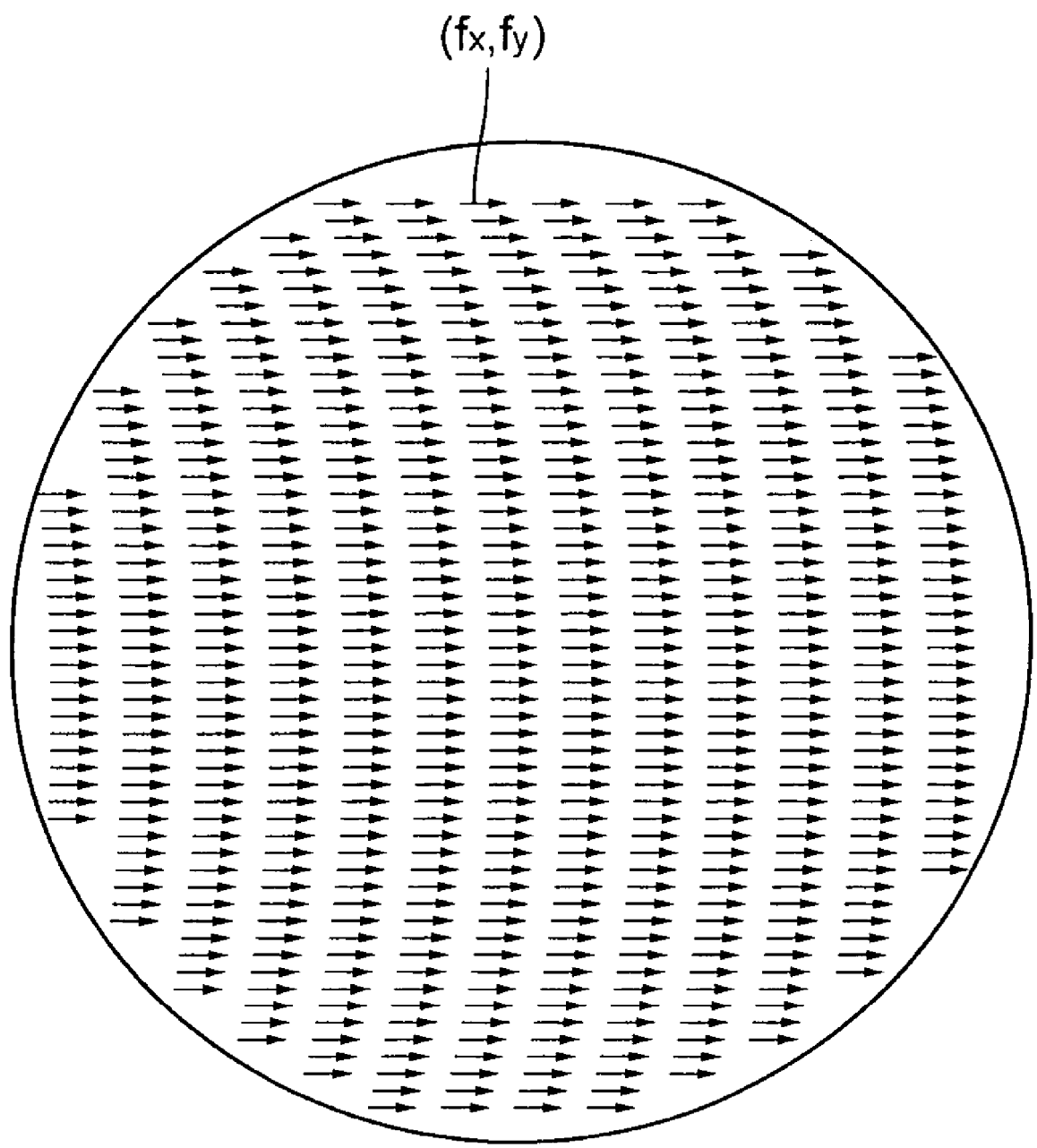
FIG. 15 is a plan view showing the components of the error vectors measured in the embodiment of the present invention, which are attributable to the stepper.

Meanwhile, FIG. 15 is a plan view showing an example of distribution of $(g_x, g_y)$ in the plane of the wafer, which represents the distribution when the reticle of the stepper is distorted, for example.

As shown in FIG. 14 and FIG. 15, it is possible to understand the causes of occurrence of the error vector ΔRn by observing behaviors of the $(f_x, f_y)$ and $(g_x, g_y)$, which are useful for trouble shooting.

Incidentally, apart from the amounts such as the $(f_x, f_y)$ and $(g_x, g_y)$ which have obvious origins and are reproducible, the error vector ΔRn also includes random amounts which have unknown origins and are not reproducible. Assuming that the random vector is ΔEn, its x component $H_x(x_n, y_n)$ and y component $H_y(x_n, y_n)$ will be expressed as follows:

$$H_x(x_n, y_n) = F_x(x_n, y_n) - (f_x(x_n, y_n) + g_x(X_n, Y_n));\text{ and}$$

$$H_y(x_n, y_n) = F_y(x_n, y_n) - (f_y(x_n, y_n) + g_y(X_n, Y_n))$$

According to this embodiment, it is possible to extract the unreproducible components $H_x(x_n, y_n)$ and $H_y(x_n, y_n)$ as describe above, and to analyze the origins of the $H_x$ and $H_y$ based on the extracted values.

Furthermore, the method of forming the correction map (Section (3)) is configured to form the correction map M with the $\Delta R^{(i,j)}_{p,q}$ obtained by actual measurement. However, it is also possible to form a correction map by use of the functional values $(f_x(x_n, y_n) + g_x(X_n, Y_n), f_y(x_n, y_n) + g_y(X_n, Y_n))$ which are obtained as described above. The correction map in this case will be as shown in FIG. 16, for example.

(6) Other Embodiments

The method of obtaining the error vectors ΔRn is not limited only to the foregoing. Instead, it is also possible to obtain the error vectors ΔRn by the following method.

Figure 17A:
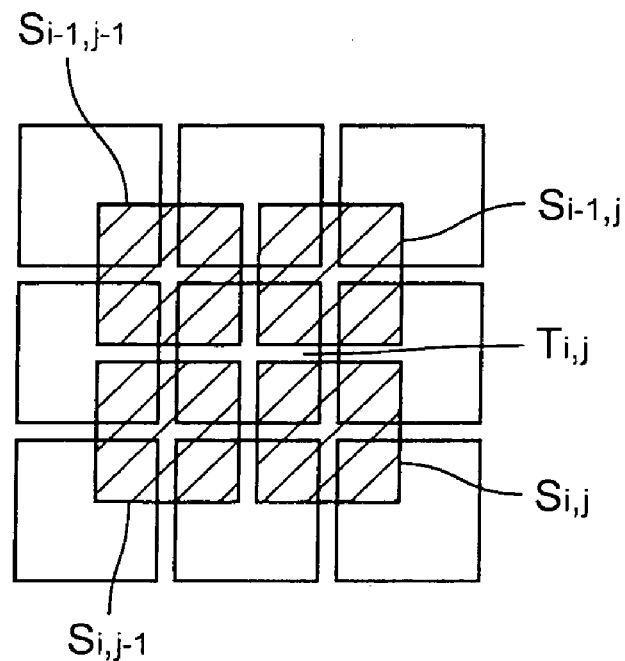
FIG. 17A and FIG. 17B are plan views for describing another method of obtaining the error vectors in the embodiment of the present invention.

Firstly, as shown in FIG. 17A, one of the second mark groups such as the second mark group Ti,j is extracted as standard marks.

Subsequently, based on this second mark group Ti,j, the error vectors $\Delta R^{(i,j)}_{p,q}$ in the four first mark groups $S_{i-1,j-1}$, $S_{i-1,j}$, $S_{i,j}$, and $S_{i,j-1}$ that are overlaid on this second mark group are measured in accordance with the method described in the method of forming the correction map (Section (3)).

Figure 17B:
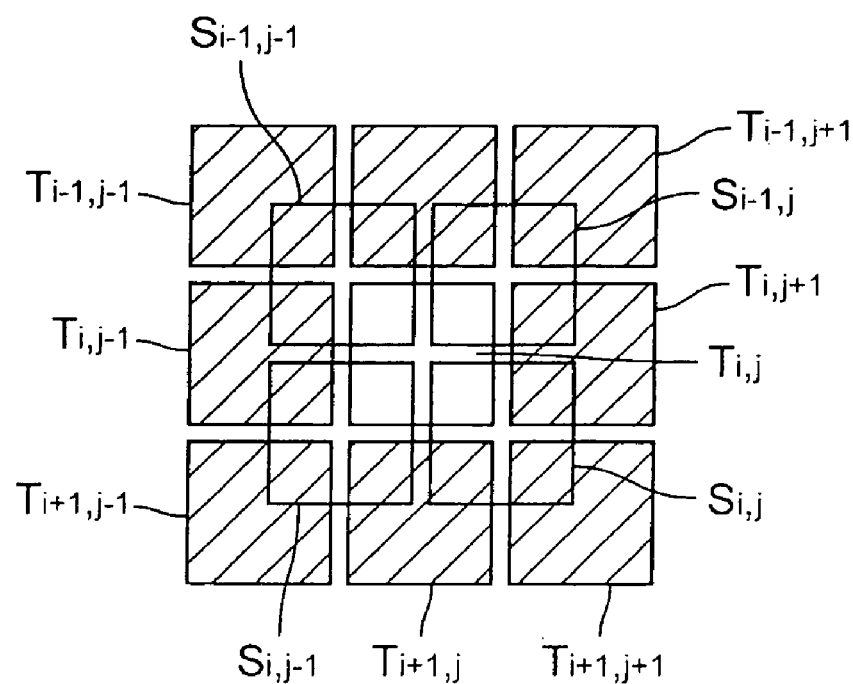

Next, as shown in FIG. 17B, based on the four first mark groups $S_{i-1,j-1}$, $S_{i-1,j}$, $S_{i,j}$, and $S_{i,j-1}$, the error vectors $\Delta R^{(i,j)}_{p,q}$ of the eight second mark groups $T_{i-1,j-1}$, $T_{i-1,j}$, $T_{i-1,j+1}$, $T_{i,j+1}$, $T_{i+1,j+1}$, $T_{i+1,j}$, $T_{i+1,j-1}$, and $T_{i,j-1}$ that are overlaid on these first mark groups are measured as similar to the foregoing.

These operations are continued until encompassing all the first and second groups.

Figure 18:
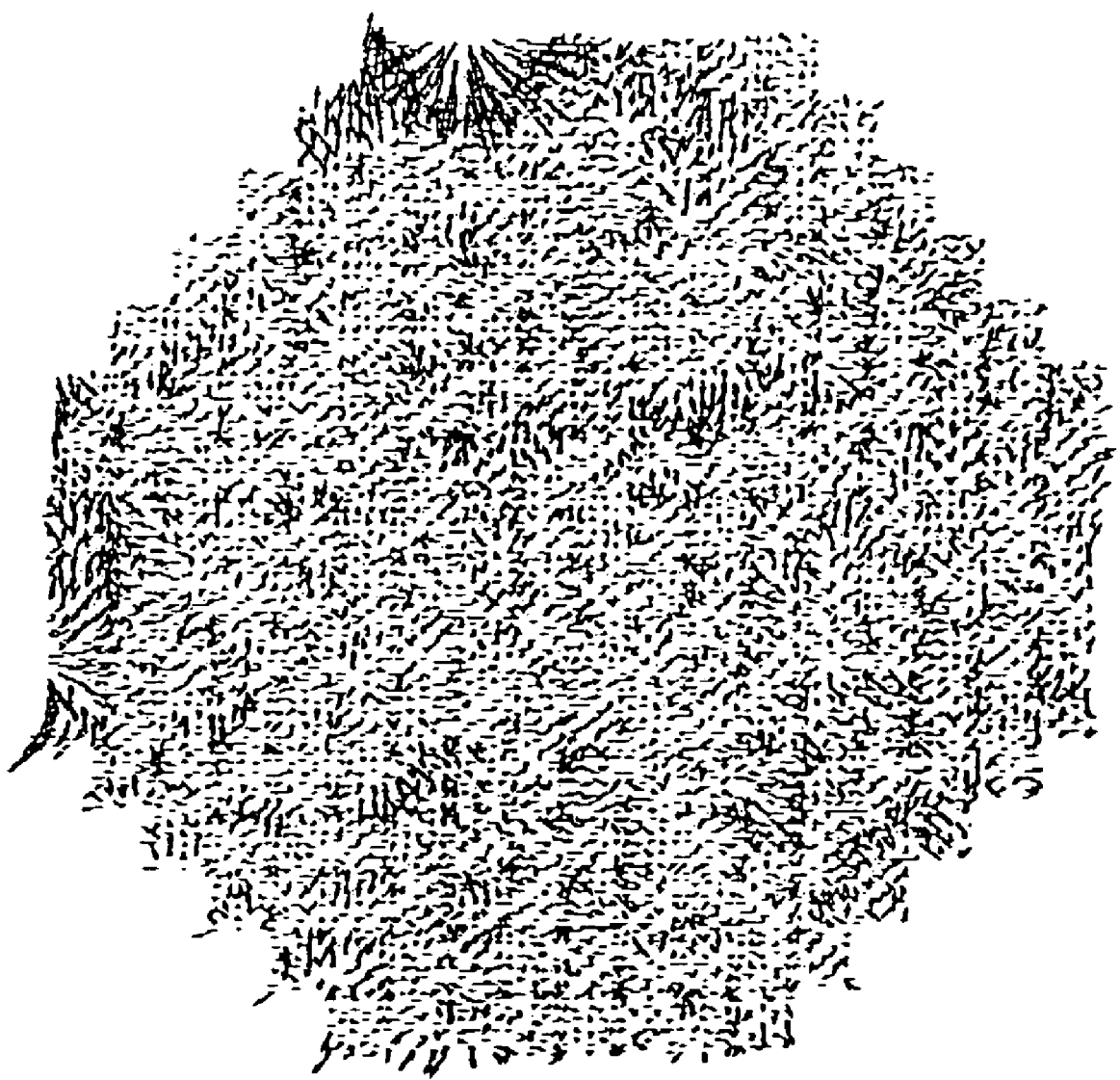
FIG. 18 is a plan view showing distribution of the error vectors in the plane of the wafer, which are actually measured in the embodiment of the present invention.

FIG. 18 is a view showing distribution of the error vectors in the wafer which are obtained by actually performing the above-described operations. It is to be noted, however, that the error vectors illustrated therein are obtained by extracting only the amounts $(g_x(X_n, Y_n), g_y(X_n, Y_n))$ that vary in the chips in accordance with the method described in classification of the causes of the errors (Section (5)).

Figure 19:
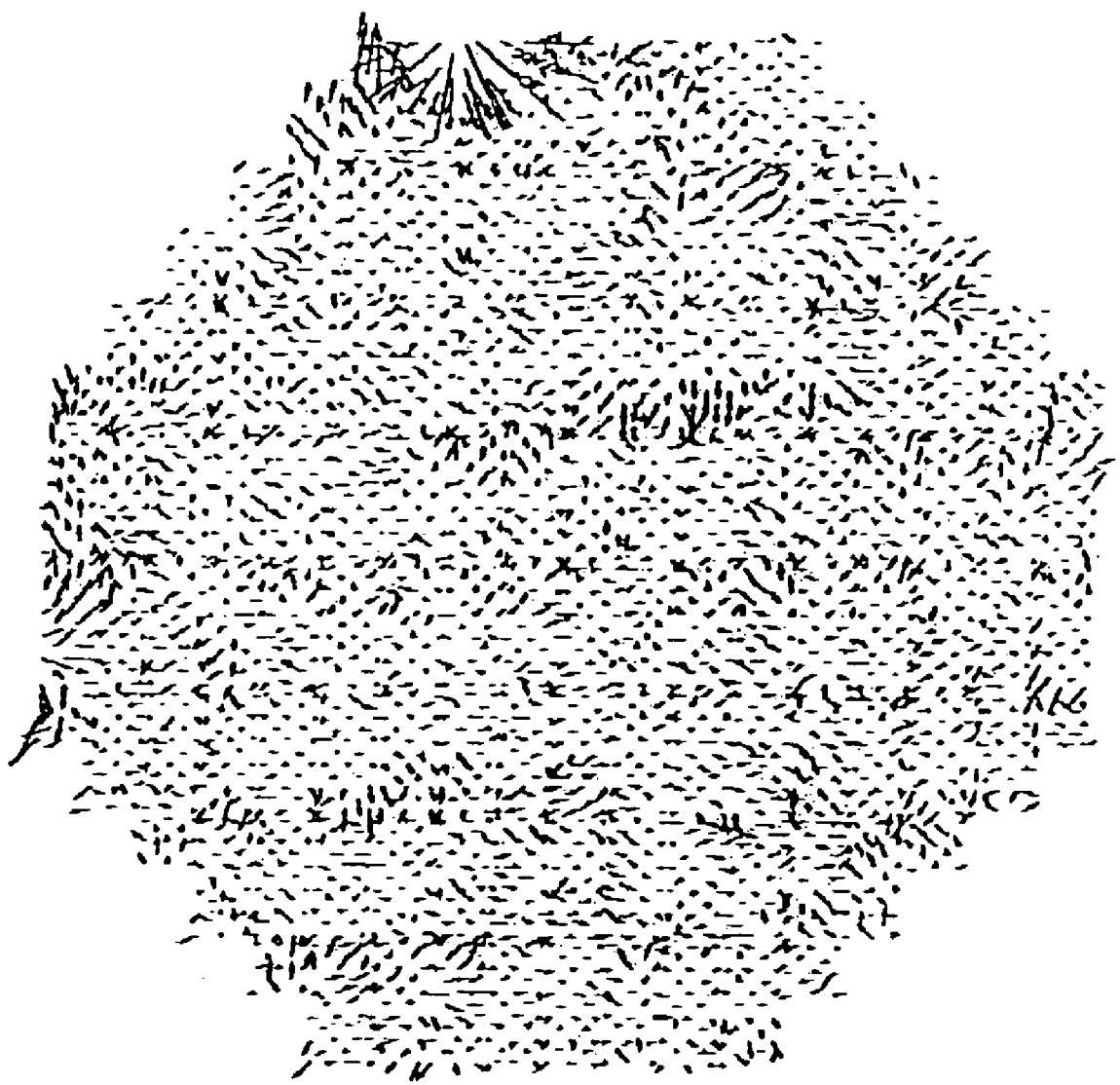
FIG. 19 is a view obtained by extracting only error vectors of a first mark group out of the error vectors shown in FIG. 18.
Figure 20:
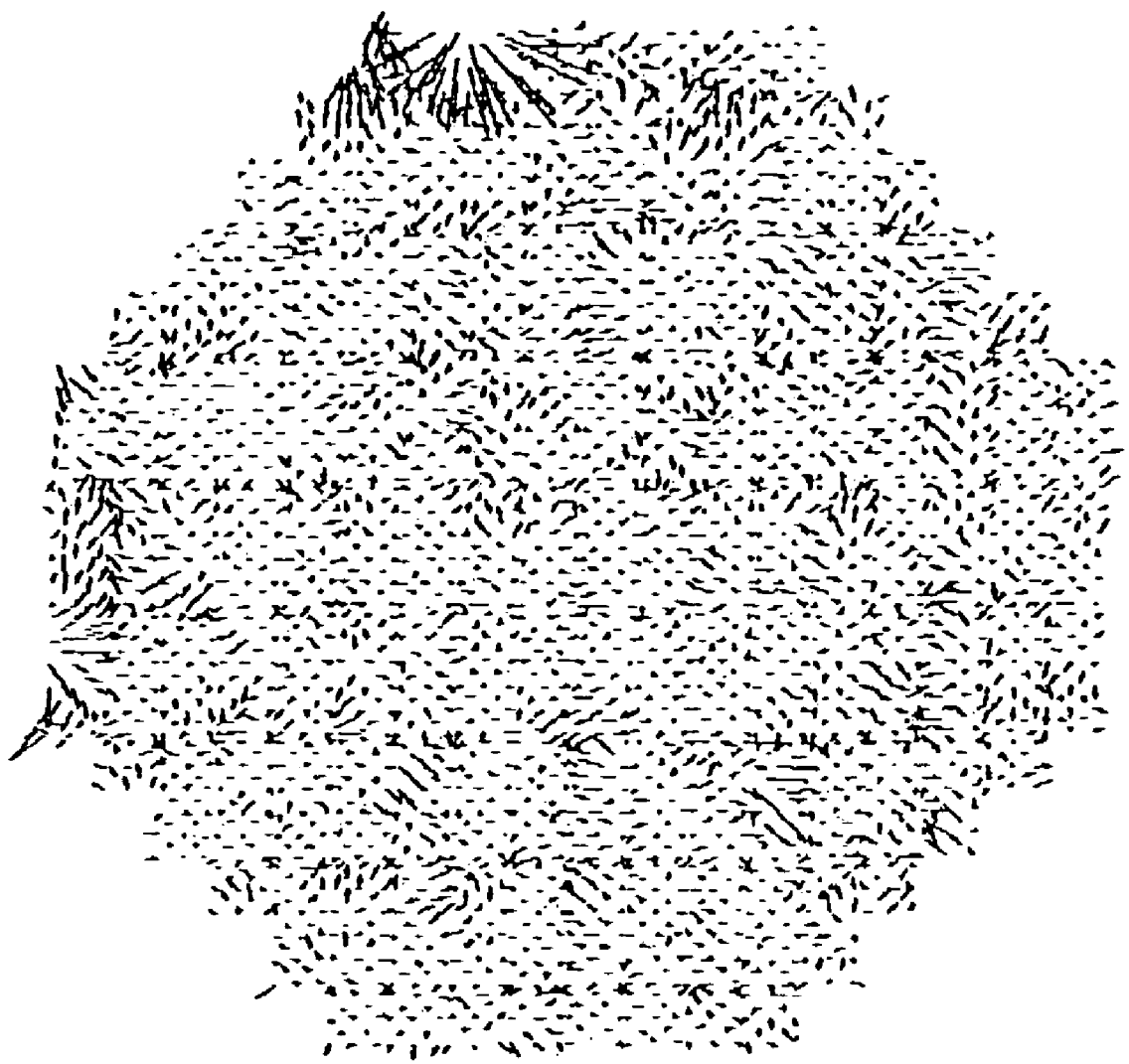
FIG. 20 is a view obtained by extracting only error vectors of a second mark group out of the error vectors shown in FIG. 18.

Meanwhile, FIG. 19 is a view obtained by extracting only the error vectors of the first mark groups Si,j out of all the error vectors shown in FIG. 18, and FIG. 20 is a view obtained by extracting only the error vectors of the second mark groups Ti,j out of all the error vectors.

It is also possible to achieve advantages similar to the above-described Sections (3) to (5) when the error vectors ΔRn are obtained by these methods.

What is claimed is:

1. A charged particle beam photolithography machine, comprising:
   a source of a charged particle;
   a deflector for deflecting the charged particle;
   a substrate table for placing a substrate;
   a standard substrate formed with a chip-shaped first mark group having a plurality of first marks and a chip-shaped second mark group having a plurality of second marks;
   a correction map having misalignment factors of the first marks obtained by measurement based on positions of the second marks in a state placed on the substrate table; and
   a deflection control unit for controlling an amount of deflection in the deflector,
   wherein the charged particle is irradiated on a product substrate while the deflection control unit makes reference to the correction map and corrects the amount of deflection as equivalent to the misalignment factors.

2. The charged particle beam photolithography machine according to claim 1, wherein the correction map comprises pairs of points on the substrate table and the misalignment factors at the points.

3. The charged particle beam photolithography machine according to claim 1,
wherein the first marks and the second marks are arranged in a matrix, and
a difference from a position of the first mark obtained by actual measurement is adopted as the misalignment factor.

4. A standard substrate for a charged particle beam photolithography machine, comprising:
a chip-shaped first mark group having a plurality of first marks; and
a chip-shaped second mark group having a plurality of second marks formed so as to be overlaid on part of the first mark group.

5. The standard substrate for a charged particle beam photolithography machine according to claim 4,
wherein the first marks and the second marks are holes formed on a surface of the standard substrate.

6. A method of correcting a charged particle beam photolithography machine, comprising the steps of:
forming a chip-shaped first mark group having a plurality of first marks on a substrate;
forming a chip-shaped second mark group having a plurality of second marks so as to be overlaid on part of the first mark group and thereby forming the substrate into a standard substrate;
placing the standard substrate on a substrate table of a charged particle beam photolithography machine and measuring misalignment factors of the first marks based on positions of the second marks;
and adopting the misalignment factors as correction values for an amount of deflection of a charged particle beam.

7. The method of correcting a charged particle beam photolithography machine according to claim 6,
wherein the first mark group and the second mark group are formed so as to be shifted by a half chip size.

8. The method of correcting a charged particle beam photolithography machine according to claim 6,
wherein the first marks and the second marks are holes formed on the substrate.

9. The method of correcting a charged particle beam photolithography machine according to claim 6,
wherein a plurality of the first mark groups and a plurality of the second mark groups are formed, and
the method further comprises the step adopting in-plane distribution of the misalignment factors of the first marks within the standard substrate as observed values and obtaining a first unknown function continuously varying within the standard substrate and a second unknown function repeated for each of the first mark groups by use of a least square method.

10. The method of correcting a charged particle beam photolithography machine according to claim 9, further comprising the step of:
forming a correction map so as to include pairs of sums of the first unknown function and the second unknown function in terms of points on the substrate table, and the points.

11. The method of correcting a charged particle beam photolithography machine according to claim 10,
wherein the step of adopting the misalignment factors as the correction values is performed by storing the correction map in a storage unit of the charged particle beam photolithography machine.

12. A method of manufacturing an electronic device comprising the steps of:
forming a chip-shaped first mark group having a plurality of first marks and a chip-shaped second mark group having a plurality of second marks so as to be partially overlaid on the first mark group on a substrate in accordance with photolithography using a photolithography machine and thereby forming the substrate into a standard substrate;
placing the standard substrate on a substrate table of a charged particle beam photolithography machine;
calculating misalignment factors of the first marks based on positions of the second marks after placing the standard substrate on the substrate table;
removing the standard substrate from the substrate table;
coating a resist on a product substrate;
placing the product substrate on the substrate table after coating the resist;
adopting the misalignment factors as correction values for an amount of deflection of a charged particle beam and irradiating a charged particle onto the resist while correcting the amount of deflection as equivalent to the correction value; and
developing the resist to form a resist pattern.

13. The method of manufacturing an electronic device according to claim 12,
wherein, prior to the step of coating the resist, the method further comprises the steps of:
forming a pattern on the product substrate in accordance with photolithography using the photolithography machine; and
forming a film on the pattern,
wherein the resist is coated on the film.

14. The method of manufacturing an electronic device according to claim 12,
wherein, prior to the step of coating the resist, the method further comprises the step of forming a first film on the product substrate,
the resist is coated on the first film, and
the method further comprises the steps of:
forming a first pattern by etching the first film while using the resist pattern as a mask;
removing the resist pattern;
forming a second film on the first pattern; and
patterning the second film to form a second pattern in accordance with photolithography using the photolithography machine.

* * * * *